US009843195B2

(12) United States Patent
Itaya

(10) Patent No.: US 9,843,195 B2
(45) Date of Patent: Dec. 12, 2017

(54) VOLTAGE MONITORING CONTROL SYSTEM, VOLTAGE MONITORING CONTROL DEVICE, MEASUREMENT DEVICE, AND VOLTAGE MONITORING CONTROL METHOD

(71) Applicant: Mitsubishi Electric Corporation, Chiyoda-ku, Tokyo (JP)

(72) Inventor: Nobuhiko Itaya, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 194 days.

(21) Appl. No.: 14/898,787

(22) PCT Filed: Jun. 26, 2013

(86) PCT No.: PCT/JP2013/067558
§ 371 (c)(1),
(2) Date: Dec. 16, 2015

(87) PCT Pub. No.: WO2014/207849
PCT Pub. Date: Dec. 31, 2014

(65) Prior Publication Data
US 2016/0204614 A1  Jul. 14, 2016

(51) Int. Cl.
*H02J 4/00* (2006.01)
*H02J 3/14* (2006.01)
(Continued)

(52) U.S. Cl.
CPC ............ *H02J 4/00* (2013.01); *G01R 19/0084* (2013.01); *G01R 19/16547* (2013.01);
(Continued)

(58) Field of Classification Search
CPC ...................................... H02J 4/00; H02J 3/14
See application file for complete search history.

(56) References Cited

U.S. PATENT DOCUMENTS 5,760,492 A * 6/1998 Kanoi ........................ H02J 3/06
307/18
7,355,374 B2 * 4/2008 Witte ..................... H02M 3/156
323/222
(Continued)

FOREIGN PATENT DOCUMENTS

JP    60-241725 A    11/1985
JP    9-154235 A    6/1997
(Continued)

OTHER PUBLICATIONS

International Search Report (PCT/ISA/210) dated Jul. 23, 2013, by the Japanese Patent Office as the International Searching Authority for International Application No. PCT/JP2013/067558.
(Continued)

*Primary Examiner* — Stephen W Jackson
*Assistant Examiner* — Pinping Sun
(74) *Attorney, Agent, or Firm* — Buchanan Ingersoll & Rooney PC

(57) ABSTRACT

A voltage monitoring control system includes voltage control apparatuses controlling voltage on a power distribution line, a local voltage control device adjusting a voltage value controlled by the voltage control apparatuses such that it is maintained within a range between voltage upper-and-lower-limit values updated every first cycle, a voltage and power-flow measurement device calculating and transmitting fluctuation-band information indicating fluctuation band of the voltage every third cycle longer than a second cycle based on voltage on the power distribution line measured every second cycle shorter than the first cycle, and a centralized voltage control device. The centralized voltage control device includes a voltage-fluctuation-band calculation unit calculating fluctuation band within the first cycle, an optimal-voltage-distribution determination unit determining a threshold value for allowance for each of upper and
(Continued)

lower limits of an appropriate voltage range and acquiring an optimal control amount, and a voltage upper-and-lower-limit-value determination unit.

13 Claims, 8 Drawing Sheets

(51) Int. Cl.
  *G01R 19/00* (2006.01)
  *G01R 19/165* (2006.01)
  *H02J 13/00* (2006.01)
(52) U.S. Cl.
  CPC ............ *H02J 3/14* (2013.01); *H02J 13/0017* (2013.01); *Y02B 70/3225* (2013.01); *Y04S 20/222* (2013.01)

(56) References Cited

U.S. PATENT DOCUMENTS

| | | | | |
|---|---|---|---|---|
| 8,362,642 | B2* | 1/2013 | Zerbe | G06F 1/26 307/43 |
| 8,624,561 | B1* | 1/2014 | Slavin | H02J 3/383 136/291 |
| 2009/0284232 | A1* | 11/2009 | Zhang | G05F 1/67 322/89 |
| 2012/0323390 | A1* | 12/2012 | Kobayasi | H02J 3/14 700/295 |
| 2014/0288725 | A1 | 9/2014 | Itaya | |
| 2015/0326018 | A1* | 11/2015 | Hidaka | G01R 21/00 307/24 |

FOREIGN PATENT DOCUMENTS

| | | |
|---|---|---|
| JP | 9-322404 A | 12/1997 |
| JP | 11-289663 A | 10/1999 |
| JP | 11-289664 A | 10/1999 |
| JP | 2000-102171 A | 4/2000 |
| JP | 2002-165367 A | 6/2002 |
| JP | 2004-56931 A | 2/2004 |
| JP | 2005-269744 A | 9/2005 |
| JP | 2007-330067 A | 12/2007 |
| JP | 2009-65788 A | 3/2009 |
| JP | 2009-71889 A | 4/2009 |
| WO | WO 2013-065114 A1 | 5/2013 |

OTHER PUBLICATIONS

Written Opinion (PCT/ISA/237) dated Jul. 23, 2013, by the Japanese Patent Office as the International Searching Authority for International Application No. PCT/JP2013/067558.

* cited by examiner

VOLTAGE MONITORING CONTROL SYSTEM, VOLTAGE MONITORING CONTROL DEVICE, MEASUREMENT DEVICE, AND VOLTAGE MONITORING CONTROL METHOD

FIELD

The present invention relates to a voltage monitoring control system, a voltage monitoring control device, a measurement device, and a voltage monitoring control method.

BACKGROUND

A power distribution system is generally made up of a high-voltage system (normally, 6600 V) and a low-voltage system (for example, 100 V to 200 V). Power-receiving terminals used by general consumers are connected to the low-voltage system. Electric utilities are obligated to maintain the voltage at the power-receiving terminals used by general consumers within an appropriate range (for example, maintain the voltage between 95 V and 107 V in the case of a receiving power of 100 V). Therefore, power utilities adjust the amount of control (for example, operate the tap) of a voltage control apparatus (such as an LRT (Load Ratio Control Transformer: on-load tap-changer transformer) or an SVR (Step Voltage Regulator)) connected to the high-voltage system in order to maintain the voltage at the power-receiving terminals used by general consumers. In the following descriptions, the power distribution system indicates a high-voltage system thereof unless otherwise specified.

Conventionally, a local voltage control device is commonly used for voltage control in power distribution systems. The local voltage control device is integrated with or provided along with a transformer-type voltage control apparatus such as an LRT or an SVR, and it controls the voltage of the voltage control apparatus in an autonomous distributed manner on the basis of measurement information (voltage and power flow) near the location point of the voltage control apparatus. However, in recent years, for example, due to diversification in the use of electricity and the widespread use of distributed power supplies due to photovoltaic power generation and the like, the load distribution in the power distribution system tends to fluctuate greatly and non-uniformly over time. This makes it difficult to maintain an appropriate voltage for conventional voltage control in the power distribution system.

Therefore, instead of the voltage control system of the autonomous distribution type, a method has been proposed to provide centralized control of the voltage of the power distribution system in a consistent manner over the entire system (a centralized control method). Specifically, a mechanism has been proposed in which measurement information (voltage and power flow) at multiple points within the power distribution system is collected in a centralized voltage control device by using a dedicated network, this centralized voltage control device determines the amount of control of each voltage control apparatus on the basis of the measurement information, and then the centralized voltage control device automatically and remotely indicates the amount of control to each voltage control apparatus (see, for example, Patent Literature 1).

CITATION LIST

Patent Literature

Patent Literature 1: Japanese Patent Application Laid-open No. H9-322404

SUMMARY

Technical Problem

However, the connection of distributed power supplies to the low-voltage system due to photovoltaic power generation has recently been increasing every year. Therefore, for example, when the amount of photovoltaic power generation greatly changes because of abrupt changes in the amount of solar radiation caused by cloud flow during clear skies, a voltage change in the power distribution system due to this significant change in the amount of photovoltaic power generation may reach a level that cannot be ignored. The centralized voltage control device collects measurement information on the voltage and the power flow at each point of the power distribution system, and it assigns an optimal control to each voltage control apparatus. The optimal control is determined on the basis of the measurement information on the voltage and the power flow at the time. Therefore, when many photovoltaic power-generation devices are connected to the low-voltage system, there is a concern about the following problems.

(1) When the measurement monitoring cycle is extended (to several tens of minutes, for example), then, in a case such as when the amount of photovoltaic power generation greatly changes due to abrupt changes in the amount of solar radiation caused by cloud flow, the centralized voltage control device cannot follow the sudden voltage fluctuations.

(2) In contrast, when the measurement monitoring cycle is reduced (to seconds, for example), the communication load for measurement monitoring increases. This requires a substantial capital investment in a communication network.

Meanwhile, a transformer-type voltage control apparatus controls the voltage by changing the tap position. Therefore, it is difficult to remove voltage fluctuations with a short cycle (for example, a cycle of several seconds to several tens of seconds) (hereinafter, "short-cycle fluctuations").

As described above, in the centralized voltage control device, when the communication load is taken into consideration, there are constraints to the measurement-information obtaining cycle. Therefore, the centralized voltage control device cannot identify short-cycle fluctuations in voltage. Accordingly, when the centralized voltage control device acquires an optimal voltage of a transformer-type voltage control apparatus according to the optimal control determined on the basis of the measurement information and indicates this optimal voltage as the amount of control to the transformer-type voltage control apparatus, there is a possibility that the voltage deviates from an appropriate range due to the short-cycle fluctuations. In order to prevent the voltage from deviating from the appropriate range as described above, a method is considered in which the centralized voltage control device acquires a voltage range (a voltage upper-limit value and a voltage lower-limit value) that takes into account a preset allowable amount with respect to the optimal voltage acquired according to the determined optimal control, and then indicates the voltage range to the transformer-type voltage control apparatus.

However, the centralized voltage control device cannot identify actual short-cycle fluctuations because of the problem with the communication load as described above, and therefore cannot set the allowable amount with the actual short-cycle fluctuations being taken into consideration. Due to this reason, when the actual short-cycle fluctuations in voltage are greater than the allowable amount, this results in a problem that the voltage within the power distribution system may deviate from an appropriate range. In contrast, when the allowable amount is set too large, there is a possibility of not acquiring the solution for the amount of control of the voltage to fall within an appropriate range when determining the optimal control.

Further, it is considered that the scale of the short-cycle fluctuations may differ depending on the position in the power distribution system. There is a possibility that an appropriate value of the allowable amount may differ depending on the transformer-type voltage control apparatus. However, the centralized voltage control device cannot determine the allowable amount on the basis of the actual short-cycle fluctuations as described above. Therefore, there is a possibility that while there are some points at which an excessive allowable amount is reserved when compared to the scale of the actual short-cycle fluctuations, there are some points at which the allowable amount is excessively small. Therefore, the voltage may deviate from an appropriate range.

The present invention has been achieved in view of the above, and an object of the present invention is to enable the voltage to be maintained by following voltage fluctuations in a power distribution system and to enable an appropriate voltage range to be indicated to a transformer-type voltage control apparatus without increasing the communication load.

Solution to Problem

In order to solve the above problems and achieve the object, an aspect of the present invention is a voltage monitoring control system including: a plurality of voltage control apparatuses that are connected to a power distribution line in a high-voltage system and control a voltage on the power distribution line; a plurality of local voltage control devices that adjust an amount of control of the voltage control apparatuses such that a voltage value controlled by the voltage control apparatuses is maintained within a range between a voltage upper-limit value and a voltage lower-limit value that are updated every first cycle; a measurement device that is connected to the power distribution line, that measures a voltage on the power distribution line every second cycle, which is shorter than the first cycle, that calculates fluctuation-band information, which indicates a fluctuation band of the voltage, on a basis of a measured voltage every third cycle, which is longer than the second cycle, and that transmits the fluctuation-band information; and a centralized voltage control device that is connected to the local voltage control devices and the measurement device via a communication network, wherein the centralized voltage control device includes a transceiver unit that communicates with the local voltage control devices via the communication network and receives the fluctuation-band information from the measurement device via the communication network, a voltage-fluctuation-band calculation unit that calculates a fluctuation band of the voltage within the first cycle on a basis of the fluctuation-band information, a control-target-voltage determination unit that determines a first threshold value for an allowance for an upper limit of an appropriate voltage range and a second threshold value for an allowance for a lower limit of an appropriate voltage range on a basis of the fluctuation band calculated by the voltage-fluctuation-band calculation unit, and that determines a control target value to be indicated to each of the local voltage control devices on a basis of a difference between the first threshold value and the allowance for the upper limit and on a basis of a difference between the second threshold value and the allowance for the lower limit, and a voltage upper-and-lower-limit-value determination unit that determines a voltage upper-limit value and a voltage lower-limit value to be transmitted to each of the local voltage control devices via the transceiver unit on a basis of the control target value.

Advantageous Effects of Invention

According to the present invention, an effect is obtained where it is possible to maintain the voltage by following voltage fluctuations in a power distribution system and to indicate an appropriate voltage range to a transformer-type voltage control apparatus without increasing the communication load.

DESCRIPTION OF EMBODIMENTS

Exemplary embodiments of a voltage monitoring control system, a voltage monitoring control device, a measurement device, and a voltage monitoring control method according to the present invention will be explained below in detail with reference to the drawings. The present invention is not limited to the embodiments.

Embodiment

Figure 1:
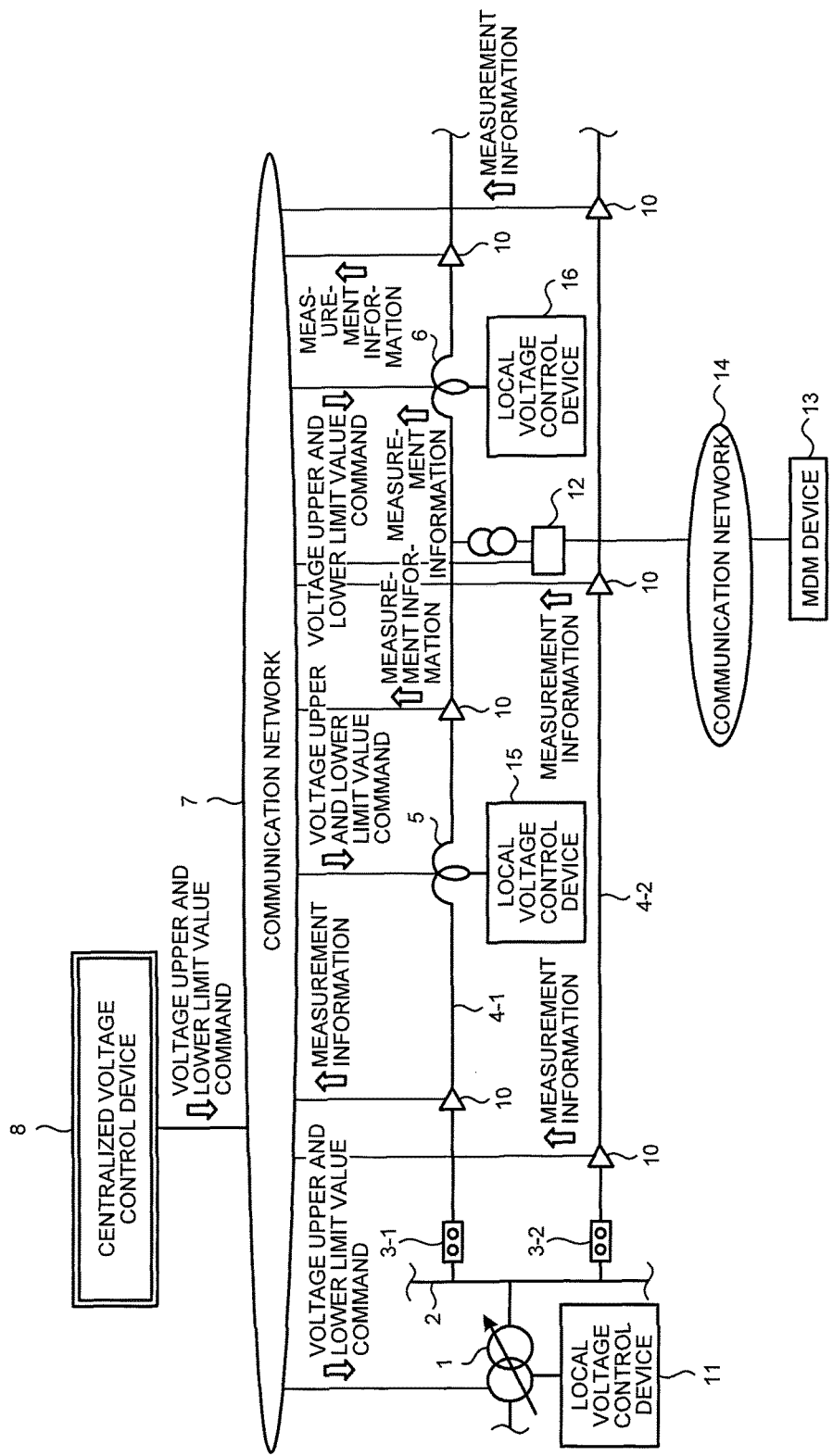
FIG. 1 is a diagram illustrating a configuration example of a voltage control system in a power distribution system according to an embodiment of the present invention.

FIG. 1 is a diagram illustrating a configuration example of a voltage control system in a power distribution system according to an embodiment of the present invention. In FIG. 1, a voltage control apparatus 1 is, for example, an LRT (Load Ratio Control Transformer: on-load tap changer transformer) that functions as a power-distribution transformer provided in a substation. A local voltage control device 11 is connected to the voltage control apparatus 1. The local voltage control device 11 controls the voltage control apparatus 1. The local voltage control device (voltage control device) 11 can, for example, be provided integrally with or provided along with the voltage control apparatus 1. The local voltage control device 11 controls the voltage control apparatus 1 by adjusting the amount of control of the voltage control apparatus 1, specifically, by adjusting the tap position. The local voltage control device 11 has a communication function and is connected to a communication network 7.

On the secondary side of the voltage control apparatus 1, a bus-bar 2 is connected. For example, two power distribution lines 4-1 and 4-2, which are in parallel, are connected to the bus-bar 2. The power distribution lines 4-1 and 4-2 are high-voltage system (with a voltage level of 6600 V) power distribution lines.

The power distribution line 4-1 is connected at its one end to the bus-bar 2 via a breaker 3-1. At multiple points on the power distribution line 4-1, voltage and power-flow measurement devices 10 (measurement devices) are respectively provided, each of which measures the voltage and the power flow on the power distribution line 4-1. That is, the voltage and power-flow measurement devices 10 are connected to the power distribution line 4-1, measure the voltage and the power flow at the connection points, and output the results of processing, such as statistical processing, performed on the measurement values as measurement information. A smart meter 12 (measurement device) is also connected to the power distribution line 4-1. The smart meter 12 measures the voltage at the connection point with the power distribution line 4-1, and outputs the result of processing, such as statistical processing, performed on the measurement value as measurement information. The voltage and power-flow measurement devices 10 and the smart meter 12 have a communication function and are connected to the communication network 7. The voltage and power-flow measurement devices 10 and the smart meter 12, for example, regularly transmit measurement information to a centralized voltage control device 8 via the communication network 7. The measurement information transmitted from the voltage and power-flow measurement devices 10 and the smart meter 12 is described later. The centralized voltage control device 8 determines the target voltage distribution and the operating state of each voltage control apparatus with which the target voltage distribution is attained, in an objective region of the system, and gives a command value to each voltage control apparatus. The centralized voltage control device 8 can be provided in a service station, a control station, or the like, that manages the objective region of the system.

On the power distribution line 4-1, voltage control apparatuses 5 and 6 are also connected, each of which is an SVR (Step Voltage Regulator) that compensate for a voltage drop. To the voltage control apparatus 5, a local voltage control device 15, which controls the voltage control apparatus 5, is connected. The local voltage control device 15 can, for example, be provided integrally with or provided along with the voltage control apparatus 5. The local voltage control device 15 controls the voltage control apparatus 5 by adjusting the amount of control of the voltage control apparatus 5, specifically, by adjusting the tap position. Similarly, to the voltage control apparatus 6, a local voltage control device 16, which controls the voltage control apparatus 6, is connected. The local voltage control device 16 controls the voltage control apparatus 6. The local voltage control devices 15 and 16 have a communication function and are connected to the communication network 7.

The power distribution line 4-2 is connected at its one end to the bus-bar 2 via a breaker 3-2. At multiple points on the power distribution line 4-2, similarly to the power distribution line 4-1, the voltage and power-flow measurement devices 10 are respectively provided, each of which measures the voltage and the power flow on the power distribution line 4-2.

The power distribution lines 4-1 and 4-2 are high-voltage system power distribution lines. Although not illustrated, low-voltage power distribution lines that constitute the low-voltage system (with a voltage level of 100 V to 200 V, for example) are connected respectively to the power distribution lines 4-1 and 4-2 via transformers. In addition to loads being connected to the low-voltage power distribution lines, distributed power supplies such as photovoltaic power-generation devices are further connected thereto. That is, in the present embodiment, distributed power supplies are connected to the low-voltage system. However, the present embodiment can also be applied to the case where distributed power supplies are not included in the low-voltage system. As an example of the distributed power supply, a photovoltaic power-generation device is described below. Voltage control in a power distribution system means voltage control in a high-voltage system. This power distribution system is configured to include the voltage control apparatuses 1, 5, and 6, the local voltage control devices 11, 15, and 16, the bus-bar 2, the breakers 3-1 and 3-2, the power distribution lines 4-1 and 4-2, and the voltage and power-flow measurement devices 10.

While in the illustrated example, two power distribution lines are connected to the bus-bar 2, the number of power distribution lines is not limited to this example. Further, the number of voltage control apparatuses to be provided, the number of the voltage and power-flow measurement devices 10, and the number of the smart meters 12 are not limited to the illustrated example. Furthermore, it is adequate if either the voltage and power-flow measurement device 10 or the smart meter 12 is only provided.

An MDM (Meter Data Management) device 13 is connected to the smart meter 12 via a communication network 14 to collect measurement amounts measured by the smart meter 12 for automatic meter reading and the like and to provide the measurement amounts or the result of statistical processing performed on the measurement amounts. The communication network 14 can be a dedicated network, or a public line can be used for the communication network 14. It is assumed that the communication network 14 and the communication network 7 are different from each other; however, the communication network 14 and the communication network 7 may be identical to each other. The measurement amounts collected by the MDM device 13 are set separately from voltage control of the present invention and there are no limitations to the measurement amounts. Accordingly, descriptions of the processing performed on the measurement amounts in the MDM device 13 are omitted. However, in the present embodiment, as described above, the smart meter 12 performs statistical processing on the voltage measurement value and transmits the processing result as measurement information to the centralized voltage control device 8 separately from the transmission of the measurement amounts to the MDM device 13. Specifics of the measurement information to be transmitted to the centralized voltage control device 8 can be indicated by the MDM device 13 to the smart meter 12 or can be set in the smart meter 12 in advance.

The centralized voltage control device (voltage monitoring control device) 8 is connected to the local voltage control devices 11, 15, and 16, the voltage and power-flow measurement devices 10, and the smart meter 12, via the communication network 7. The communication network 7 is, for example, a dedicated network and is provided for the purpose of monitoring and controlling the power distribution system. For example, on the basis of the measurement information transmitted from the voltage and power-flow measurement devices 10, the centralized voltage control device 8 determines a command value that is a control target for each local voltage control device, for example, every centralized-control cycle (one-hour cycle, for example). The centralized voltage control device 8 then indicates the command value individually to each local voltage control device via the communication network 7. The centralized voltage control device 8 indicates the voltage upper-limit value and the voltage lower-limit value (hereinafter, "voltage upper and lower limit values"), which specify the voltage range, as a command value to the local voltage control devices (the local voltage control devices 11, 15, and 16 in the example of FIG. 1), which control the transformer-type voltage control apparatuses (the voltage control apparatuses 1, 5, and 6 in the example of FIG. 1).

On the basis of the command regarding the voltage upper and lower limit values from the centralized voltage control device 8, each local voltage control device that controls a transformer-type voltage control apparatus controls its control-target voltage control apparatus such that the voltage is maintained between the voltage upper and lower limit values. Every time each local voltage control device receives the command regarding the voltage upper and lower limit values from the centralized voltage control device 8, the local voltage control device updates and sets the voltage upper-limit value and the voltage lower-limit value. For example, on the basis of the voltage upper and lower limit values indicated by the centralized voltage control device 8, within the period of the centralized-control cycle during which the voltage upper and lower limit values are used, the local voltage control device 11 adjusts the amount of control (the amount of change of the tap position) of the voltage control apparatus 1 every local-control cycle, which is shorter than the centralized-control cycle (first cycle), such that the voltage on the secondary side of the voltage control apparatus 1 falls between the voltage upper and lower limit values (within a control-target voltage range).

Figure 2:
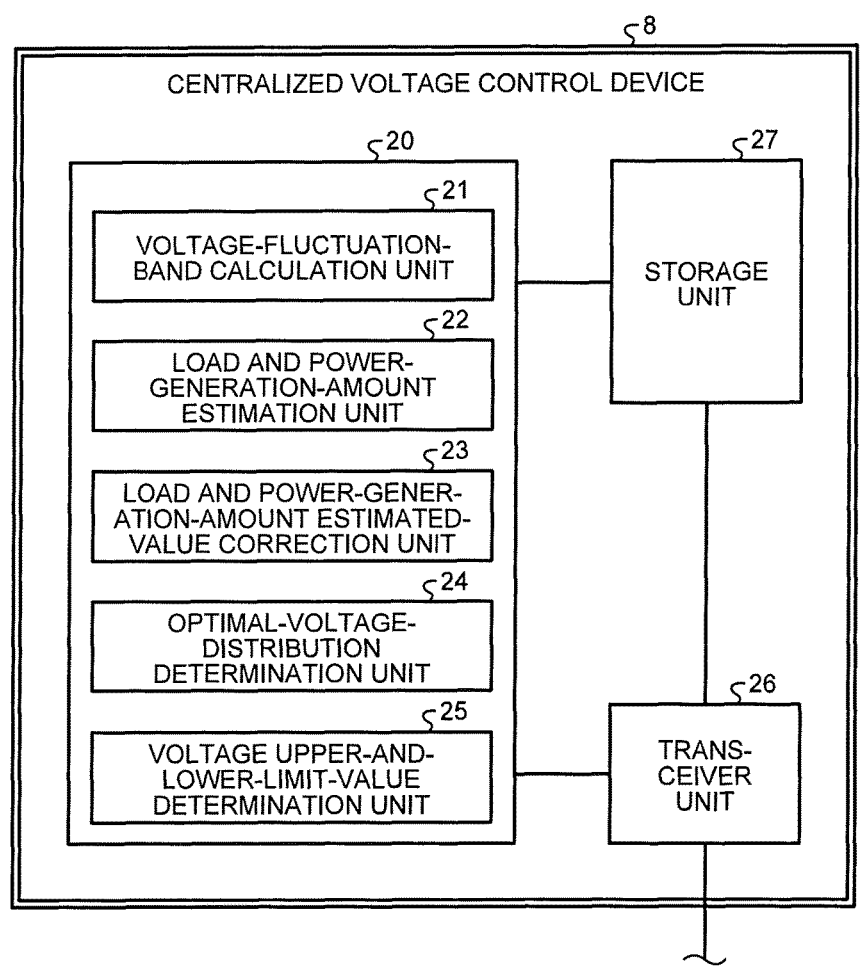
FIG. 2 is a diagram illustrating an example of an internal configuration of a centralized voltage control device.

FIG. 2 is a diagram illustrating an example of the internal configuration of the centralized voltage control device 8. As illustrated in FIG. 2, the centralized voltage control device 8 includes a control unit 20, a storage unit 27, which is connected to the control unit 20, and a transceiver unit 26. The transceiver unit 26 is connected to the control unit 20, the storage unit 27, and the communication network 7, and communicates with each local voltage control device.

The functional configuration of the control unit 20 includes a voltage-fluctuation-band calculation unit 21, a load and power-generation-amount estimation unit 22, a load and power-generation-amount estimated-value correction unit 23, an optimal-voltage-distribution decision unit (control-target-voltage decision unit) 24, and a voltage upper-and-lower-limit-value determination unit 25. The voltage-fluctuation-band calculation unit 21 calculates a voltage fluctuation band at each point on the basis of the measurement information received from the voltage and power-flow measurement device 10. The load and power-generation-amount estimation unit 22 estimates the future load/power-generation-amount distribution in the power distribution system for such as the following day every centralized-control cycle (one-hour cycle, for example). The load/power-generation amount is equivalent to the amount obtained by subtracting the power-generation amount from the pure load. When the load/power-generation amount is a positive value, this positive value is a load amount. When the load/power-generation amount is a negative value, this negative value is a power-generation amount. A method for estimating a load/power-generation-amount distribution is described later in detail. The load and power-generation-amount estimated-value correction unit 23 corrects the estimated value of the load/power-generation-amount distribution within the period of the centralized-control cycle on the basis of the result of the comparison between the actual value of the load/power-generation-amount distribution within the period of the immediately-previous centralized-control cycle and the estimated value within the corresponding period. The actual value of the load/power-generation-amount distribution is calculated on the basis of the measurement information.

The optimal-voltage-distribution determination unit 24 performs power-flow calculation on the basis of the corrected estimated value of the load/power-generation-amount distribution. Also, taking into account the voltage fluctuation band calculated by the voltage-fluctuation-band calculation unit 21, the optimal-voltage-distribution determination unit 24 searches for the best solution for optimizing the value of an evaluation function for evaluating the voltage distribution in the power generation system in order. Accordingly, the optimal-voltage-distribution determination unit 24 determines the optimal voltage distribution within the period of the centralized-control cycle and the optimal control amount of each voltage control apparatus. The optimal voltage distribution is the voltage distribution at each point of the system, which satisfies restraining conditions and optimizes the evaluation function. The optimal control amount is the amount of control to be indicated to each voltage control apparatus so as to achieve the optimal voltage distribution, i.e., a control-target voltage. This control-target voltage itself may be indicated as the amount of control to each voltage control apparatus. However, in the case of a transformer-type voltage control apparatus, it is not preferable to frequently change the tap position. Therefore, in the present embodiment, the centralized voltage control device 8 defines a control-target range as described below on the basis of the optimal control amount being equal to the control-target voltage and indicates the defined control-target range. A local voltage control device that controls the voltage of each transformer-type voltage control apparatus controls the voltage such that it is maintained within the control-target range.

On the basis of the determined optimal voltage distribution, the voltage upper-and-lower-limit-value determination unit 25 determines the voltage upper and lower limit values that are the upper limit and the lower limit of the control-target voltage range of each local voltage control device within the period of the centralized-control cycle. The voltage upper-and-lower-limit-value determination unit 25 then indicates these limit values to each local voltage control device via the communication network 7. The processing for determining the voltage upper and lower limit values performed by the voltage upper-and-lower-limit-value determination unit 25 is described later in detail. The outline of this processing is described as follows.

First, the voltage upper-and-lower-limit-value determination unit 25 obtains, from the storage unit 27, information regarding the region responsible for voltage control, which is assigned to each local voltage control device in advance. The region responsible for voltage control is a region (or a section) on the power distribution line 4-1 or 4-2 where a local voltage control device to which the region is assigned or a voltage control apparatus connected to this local voltage control device has the responsibility of controlling the voltage within the region.

A reactive-power-controlled voltage control apparatus sets, when there is a transformer-type voltage control apparatus on the power-supply side (on the upstream side where there is a power-distribution transformer) of the reactive-power-controlled voltage control apparatus, the region up to the load side (the downstream side) of the transformer of this transformer-type voltage control apparatus and the region on the load side of the reactive-power-controlled voltage control apparatus as the region responsible for voltage control. When there is an additional voltage control apparatus on the load side, the reactive-power-controlled voltage control apparatus includes the region up to the power-supply side of the additional voltage control apparatus in the region responsible for voltage control. A transformer-type voltage control apparatus, for example, sets the load side of the transformer as the region responsible for voltage control. However, in the case where there is an additional voltage control apparatus on the load side, the transformer-type voltage control apparatus sets the region up to the power-supply side of the additional voltage control apparatus as the region responsible for voltage control. The method for setting a region responsible for voltage control is not limited to the above example.

An appropriate voltage range is preset for each region responsible for voltage control. This appropriate voltage range is an appropriate voltage range that the high-voltage system should maintain. The optimal voltage of a voltage control apparatus is acquired so as to fall within an appropriate voltage range in the region responsible for voltage control. The difference between the optimal voltage and the lower-limit value of an appropriate voltage is referred to as a "voltage lower-limit allowable amount". The difference between the optimal voltage and the upper-limit value of an appropriate voltage is referred to as a "voltage upper-limit allowable amount".

On the basis of the optimal voltage acquired by the optimal-voltage-distribution determination unit 24, the voltage upper-and-lower-limit-value determination unit 25 determines the voltage upper and lower limit values for a local voltage control device that controls a transformer-type voltage control apparatus.

The centralized voltage control device 8 can, for example, be configured as a server including a CPU, a memory, a storage device such as a hard disk, and a communication function. The control unit 20 is realized by a CPU that performs control processing according to a control program stored in the memory. The storage unit 27 collectively represents the memory, the storage device, and other devices. The transceiver unit 26 represents a communication function. The centralized voltage control device 8 can, for example, be provided in a substation.

Next, an operation in the present embodiment is described. In the present embodiment, the centralized voltage control device 8 controls each local voltage control device every centralized-control cycle. Therefore, in the centralized control executed by the centralized voltage control device 8, voltage fluctuations with a cycle shorter than the centralized-control cycle (short-cycle fluctuations) cannot be suppressed. From the viewpoint of the communication load, the lifespan of a tap device, and other considerations, it is not practical for the centralized control to remove even short-cycle fluctuations. Accordingly, in the present embodiment, for calculating the optimal voltage distribution and calculating the amount of control to be indicated, short-cycle fluctuations are considered as an allowable amount to suppress voltage deviation due to the short-cycle fluctuations. In order to determine an appropriate allowable amount, it is desirable to identify the fluctuation band of the short-cycle fluctuations. However, from the viewpoint of the communication load, it is not practical for the centralized voltage control device 8 to obtain measurement data itself measured (per second, for example) by the voltage and power-flow measurement devices 10 and the smart meter 12 and to acquire the fluctuation band of the short-cycle fluctuations on the basis of the measurement data. Therefore, in the present embodiment, the voltage and power-flow measurement devices 10 and the smart meter 12 perform statistical processing on measurement data to acquire fluctuation information indicating fluctuations (such as a standard deviation), and then transmit measurement information including this fluctuation information to the centralized voltage control device 8. On the basis of the received measurement information, the centralized voltage control device 8 identifies the fluctuation band of the short-cycle fluctuations at respective points where the voltage and power-flow measurement devices 10 and the smart meter 12 are located.

Figure 3:
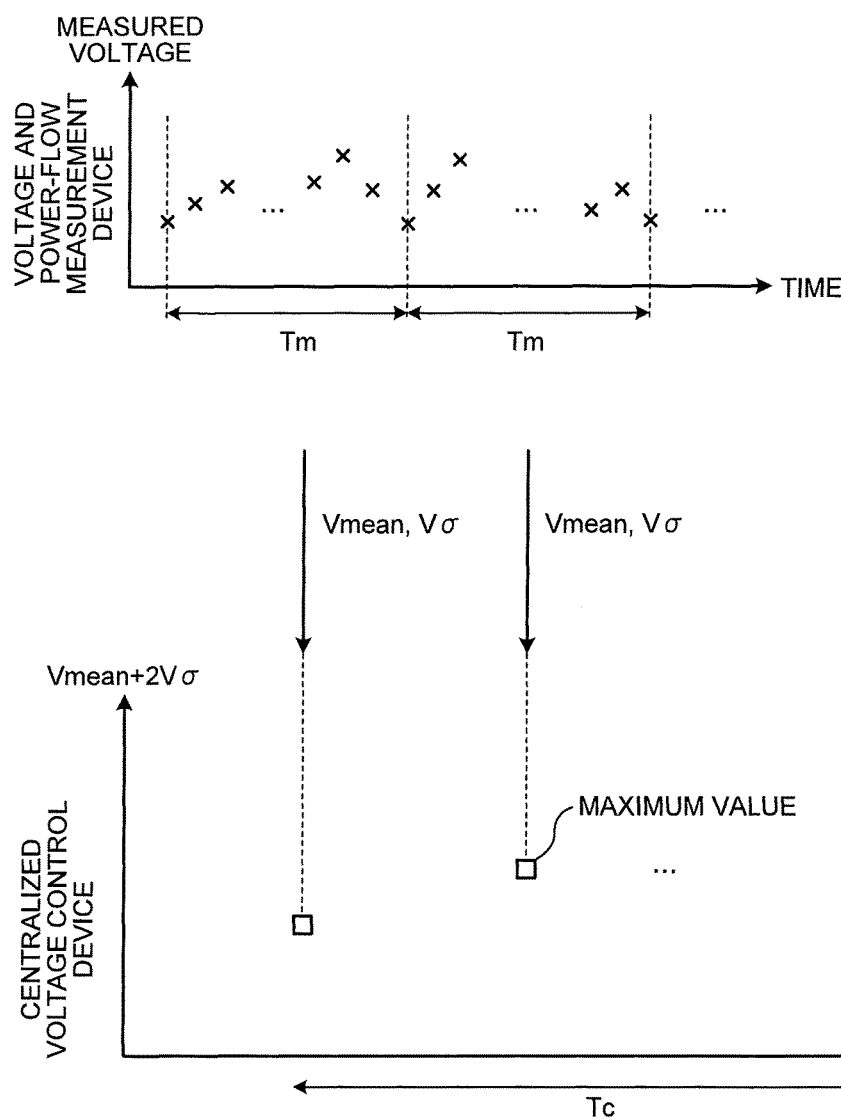
FIG. 3 is a diagram illustrating the concept of voltage measurement and voltage fluctuation-band calculation.

FIG. 3 is a diagram illustrating the concept of voltage measurement and voltage fluctuation-band calculation in the present embodiment. FIG. 3 illustrates, on its upper side, a voltage measurement state in the voltage and power-flow measurement device 10. FIG. 3 also illustrates, on its lower side, a processing state in the centralized voltage control device 8. The voltage and power-flow measurement device 10 measures the voltage and the power flow at its own individual location point at a given time interval Tp (second cycle) and saves the measurement data (the voltage and the power flow). The voltage and power-flow measurement device 10 acquires, every statistical-processing cycle Tm (third cycle) (one minute, for example), a voltage mean value Vmean and a power-flow mean value on the basis of the measurement data within Tm. In FIG. 3, the "x" marks indicate the measurement data. The voltage and power-flow measurement device 10 acquires a standard deviation Vσ of the voltage measurement data within Tm as expressed by the following equation (1). The number of pieces of measurement data within the statistical-processing cycle Tm is represented as Nd. Vi represents the i-th measurement data within the statistical-processing cycle Tm. Σ in the following equation (1) represents the sum from i=1 to i=Np.

$$V\sigma = (\Sigma (Vi - Vmean)^2 / (Nd-1))^{1/2} \quad (1)$$

While a case where Tp=1 sec and Tm=60 sec (1 minute) is described below as an example, the value of Tp and the value of Tm are not limited to this example and can be set to any value. However, it is desirable to set Tp to such a value as to be able to measure short-cycle fluctuations that need to be taken into consideration in voltage control. Where Tp=1 sec and Tm=60 sec, then Nd=60, and therefore, the voltage and power-flow measurement device 10 acquires Vmean and Vσ on the basis of 60 pieces of measurement data. The voltage and power-flow measurement device 10 transmits the acquired Vmean1, Vσ, and power-flow mean value to the centralized voltage control device 8 every statistical-processing cycle. In FIG. 3, only the voltage measurement-data processing is described; therefore, illustrations of the power-flow mean value are omitted.

In the centralized voltage control device 8, the voltage-fluctuation-band calculation unit 21 obtains Vmean and Vσ from the voltage and power-flow measurement device 10 and, on the basis of Vmean and Vσ at each point, acquires an estimated value of a maximum voltage (estimated maximum value) Vmax1 within Tm by using the following equation (2).

$$Vmax1 = Vmean + 2V\sigma \quad (2)$$

In the lower diagram of FIG. 3, each square point indicates Vmean+2Vσ (=Vmax1). The voltage-fluctuation-band calculation unit 21 in the centralized voltage control device 8 acquires a maximum value Vmax2 of Vmax1 within the centralized-control cycle Tc. Where the centralized-control cycle is one hour, the number of values of Vmax1 within the centralized-control cycle Tc is 60. Vmax1 is equivalent to an estimated value of the maximum voltage within the centralized-control cycle. Although not illustrated, the voltage-fluctuation-band calculation unit 21 similarly acquires an estimated value of minimum voltage (estimated minimum value) Vmin1 within Tm by using the following equation (3).

$$Vmin1 = Vmean - 2V\sigma \quad (3)$$

The voltage-fluctuation-band calculation unit 21 acquires the maximum value Vmax2 of Vmax1 within the centralize-control cycle Tc and a minimum value Vmin2 of Vmin1 within the centralized-control cycle Tc. Further, the voltage-fluctuation-band calculation unit 21 acquires a mean value Vmean2 of Vmean within the centralized-control cycle Tc. By using the following equation (4), the voltage-fluctuation-band calculation unit 21 then acquires the upper fluctuation band and the lower fluctuation band within the centralized-control cycle.

Upper fluctuation band=Vmax2−Vmean2

Lower fluctuation band=Vmean2−Vmin2 (4)

The voltage-fluctuation-band calculation unit 21 performs the aforementioned processing (statistical processing) for each of the voltage and power-flow measurement devices 10 to acquire the upper fluctuation band and the lower fluctuation band within the centralized-control cycle. Similarly, the smart meter 12 measures the voltage at a given time interval Tp', acquires the mean value Vmean and the standard deviation Vσ of the measurement data within the statistical-processing cycle Tm (for example, one minute), and transmits these values to the centralized voltage control device 8. Tp' can be identical to or different from Tp. The statistical-processing cycle can also be different from that in the voltage and power-flow measurement device 10. However, when both the statistical-processing cycles are identical to each other, the processing in the centralized voltage control device 8 can be standardized. In the following descriptions, an identical statistical-processing cycle is used in the voltage and power-flow measurement device 10 and the smart meter 12. Similarly, the voltage-fluctuation-band calculation unit 21 in the centralized voltage control device 8 acquires the upper fluctuation band and the lower fluctuation band within the centralized-control cycle on the basis of Vmean and Vσ received from the smart meter 12.

The method for acquiring the upper fluctuation band and the lower fluctuation band within the centralized-control cycle has been described above. However, the above method is merely an example, and the method for acquiring the upper fluctuation band and the lower fluctuation band within the centralized-control cycle is not limited to the above example. For example, in the above equations (2) and (3), instead of 2Vσ, a value such as Vσ or 3Vσ can be used. Any method can be employed as long as the voltage and power-flow measurement device 10 and the smart meter 12 calculate and transmit information indicating a fluctuation band of short-cycle fluctuations in voltage (fluctuation-band information), such as Vσ, and the centralized voltage control device 8 can calculate the upper fluctuation band and the lower fluctuation band within the centralized-control cycle on the basis of the fluctuation-band information.

For another example, the upper fluctuation band and the lower fluctuation band within the centralized-control cycle can be acquired by the following method. The voltage and power-flow measurement device 10 and the smart meter 12 acquire a maximum value Vmax1' and a minimum value Vmin1' of voltage measurement data within Tm. The voltage and power-flow measurement device 10 and the smart meter 12 then acquire WUmax and WLmax, which are respectively equivalent to the upper maximum fluctuation band and the lower maximum fluctuation band within Tm, as fluctuation-band information by using the following equation (5).

$$WUmax = Vmax1' - Vmean$$

$$WLmax = Vmean - Vmin1' \quad (5)$$

The voltage and power-flow measurement device 10 and the smart meter 12 transmit Vmean, WUmax, and WLmax to the centralized voltage control device 8. On the basis of Vmean, WUmax, and WLmax, the voltage-fluctuation-band calculation unit 21 in the centralized voltage control device 8 calculates Vmean+WUmax and Vmean−WLmax. For example, where Tm=60 sec and Tc=1 hour, 60 values of Vmean+WUmax and 60 values of Vmean−WLmax are calculated. The voltage-fluctuation-band calculation unit 21 then uses the maximum value of Vmean+WUmax within the centralized-control cycle as Vmax2 and uses the minimum value of Vmean−WLmax within the centralized-control cycle as Vmin2 to acquire the upper fluctuation band and the lower fluctuation band within the centralized-control cycle by using the above equation (4). This method is advantageous in that the processing in the voltage and power-flow measurement device 10 and the smart meter 12 can be simplified. However, because this method uses a maximum value and a minimum value of measurement data itself, there is a possibility for this method to be affected by an unusual voltage change caused by noise.

In order to further simplify the processing in the voltage and power-flow measurement device 10 and the smart meter 12, WUmax and WLmax may be acquired by using the following equation (6).

$$WUmax = WLmax =$$

$$(Vmax1' - Vmin1')/2 \quad (6)$$

Further, the voltage and power-flow measurement device 10 and the smart meter 12 may acquire the maximum value Vmax1' and the minimum value Vmin1' of voltage measurement data within Tm and transmit Vmean, Vmax1', and Vmin1' to the centralized voltage control device 8, and then the voltage-fluctuation-band calculation unit 21 in the centralized voltage control device 8 may acquire WUmax and WLmax by using the above equation (5) or (6). Furthermore, the voltage-fluctuation-band calculation unit 21 may acquire the maximum value of Vmax1' within the centralized-control cycle and the minimum value of Vmin1' within the centralized-control cycle, define, as the upper fluctuation band, a value obtained by subtracting Vmean2 from the maximum value of Vmax1' within the centralized-control cycle, and define, as the lower fluctuation band, a value obtained by subtracting the minimum value of Vmin1' within the centralized control cycle from Vmean2.

Furthermore, the upper fluctuation band and the lower fluctuation band within the centralized-control cycle may be acquired by the method as follows. In the same manner as the above example, the voltage and power-flow measurement device 10 and the smart meter 12 calculate Vσ by using the equation (1) and transmit Vmean and Vσ to the centralized voltage control device 8. The voltage-fluctuation-band calculation unit 21 in the centralized voltage control device 8 acquires a maximum value Vσmax of Vσ within the centralized-control cycle and defines Vmax1=Vmean+2Vσmax and Vmin1=Vmean−2Vσmax to acquire the maximum value Vmax2 of Vmax1 within the centralized-control cycle Tc, the minimum value Vmin2 of Vmin1 within the centralized-control cycle Tc, and the mean value Vmean2 of Vmean within the centralized-control cycle Tc. By using the above equation (4), the voltage-fluctuation-band calculation unit 21 then acquires the upper fluctuation band and the lower fluctuation band within the centralized-control cycle.

The maximum value of 2Vσmax described above within the centralized-control cycle may be used as the upper fluctuation band and the lower fluctuation band within the centralized-control cycle. Further, WUmax and WLmax in the above equation (5) or (6) may be used to define the maximum value of WUmax within the centralized-control cycle as the upper fluctuation band and define the maximum value of WLmax within the centralized-control cycle as the lower fluctuation band.

There have been described above multiple examples of the statistical-processing method in the voltage and power-flow measurement device 10 and the smart meter 12, and also of the calculation method of the upper fluctuation band and the lower fluctuation band within the centralized-control cycle. However, the statistical-processing method and the calculation method are not limited to the above examples, and any method can be used.

Figure 4:
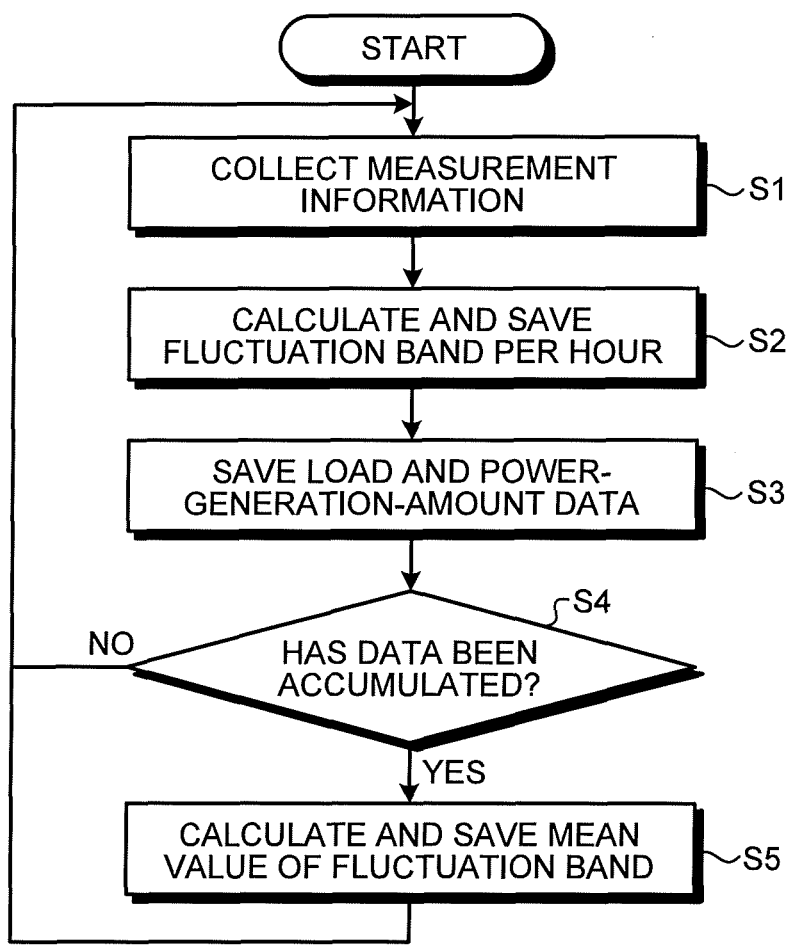
FIG. 4 is a flowchart illustrating an example of a processing procedure regarding information stored in the form of a database.

The centralized voltage control device 8 in the present embodiment saves information to be used for calculating the optimal voltage distribution in the storage unit 27 in the form of a database. FIG. 4 is a flowchart illustrating an example of a processing procedure regarding information stored in the form of a database. First, the centralized voltage control device 8 collects measurement information transmitted from the voltage and power-flow measurement device 10 and the smart meter 12 (Step S1). The measurement information includes the voltage mean value Vmean, the power-flow mean value, and the voltage standard deviation Vσ (or WUmax and WLmax described above, or the like).

The centralized voltage control device 8 calculates the upper fluctuation band and the lower fluctuation on the basis of the voltage mean value Vmean and the voltage standard deviation Vσ (or WUmax and WLmax described above, or the like), and saves, in the storage unit 27 in the centralized voltage control device 8, the calculated upper fluctuation band and lower fluctuation band at each point of the power distribution system (the location position of each of the voltage and power-flow measurement devices 10 and the smart meter 12) (Step S2). When the centralized-control cycle is one hour, one day (24 hours) is divided into 24 one-hour time slots (the time slot from 0 am to 1 am, the time slot from 1 am to 2 am, . . . ) to store the upper fluctuation band and the lower fluctuation band for each time slot. The centralized voltage control device 8 then calculates the upper fluctuation band and the lower fluctuation band every centralized-control cycle on the basis of the measurement information received within the immediately-previous centralized-control cycle, and stores the calculated values in the storage unit 27. As described later, when a correlation with the amount of solar radiation is used for acquiring estimated values of the upper fluctuation band and the lower fluctuation band for the following day, the upper fluctuation band and the lower fluctuation band are stored in the storage unit 27 in association with the amount of solar radiation.

On the basis of the voltage mean value and the power-flow mean value that are received from the voltage and power-flow measurement device 10 and the smart meter 12, the load and power-generation-amount estimation unit 22 in the centralized voltage control device 8, for example, calculates the difference between the power-flow mean values at adjacent measurement points in order to acquire a load/power-generation amount at each point of the power distribution system. This load/power-generation amount at each point of the power distribution system is saved as load and power-generation amount data in the storage unit 27 (Step S3). Alternatively, the centralized voltage control device 8 also obtains actual measurement values of temperature and weather and saves the temperature in association with the load and power-generation amount data. It is satisfactory if the temperature and weather obtaining cycle is set equal to or shorter than the centralized-control cycle. The load/power-generation amount (load and power-generation amount data) is equivalent to, for example, the amount obtained by subtracting the power-generation amount from the pure load and can take a positive or negative value depending on the balance between the load amount and the power-generation amount. The load and power-generation amount data is regularly saved and is converted into a database. The load and power-generation amount data is saved for each weekday/weekend category. If the load/power-generation amount is acquired every cycle of obtaining processing data from the voltage and power-flow measurement device 10 and the smart meter 12, the load and power-generation amount data is generated, for example, at one-minute intervals. This increases the data volume. Therefore, an hourly voltage mean value and an hourly power-flow mean value may be acquired to acquire the load/power-generation amount on the basis of the acquired mean values.

In each time slot, the voltage-fluctuation-band calculation unit 21 in the centralized voltage control device 8 acquires a mean value of the upper fluctuation band and a mean value of the lower fluctuation band for a predetermined past period (one month, for example) and saves the acquired mean values in the storage unit 27. Therefore, the voltage-fluctuation-band calculation unit 21 determines whether upper fluctuation bands and lower fluctuation bands for the predetermined past period have been accumulated in the storage unit 27 (Step S4). When upper fluctuation bands and lower fluctuation bands for the predetermined past period have not been accumulated in the storage unit 27 (NO at Step S4), the procedure returns to Step S1. When upper fluctuation bands and lower fluctuation bands for the predetermined past period have been accumulated in the storage unit 27 (YES at Step S4), the voltage-fluctuation-band calculation unit 21 acquires the mean values for the predetermined past period and saves these mean values in the storage unit 27 in the form of a database (Step S5). The procedure then returns to Step S1. At Step S5, the mean values may be acquired by simply averaging the upper fluctuation bands and the lower fluctuation bands, for example, for one month without identifying the day of the week or may be acquired separately for weekdays and weekends. For example, when the mean values for one month are acquired separately for weekdays and weekends, the mean value of the upper fluctuation bands on weekdays and the mean value of the lower fluctuation bands on weekdays are generated monthly in each time slot, and also the mean value of the upper fluctuation bands on weekends and the mean value of the lower fluctuation bands on weekends are generated monthly in each time slot. These mean values are saved in the storage unit 27 in the form of a database.

Figure 5:
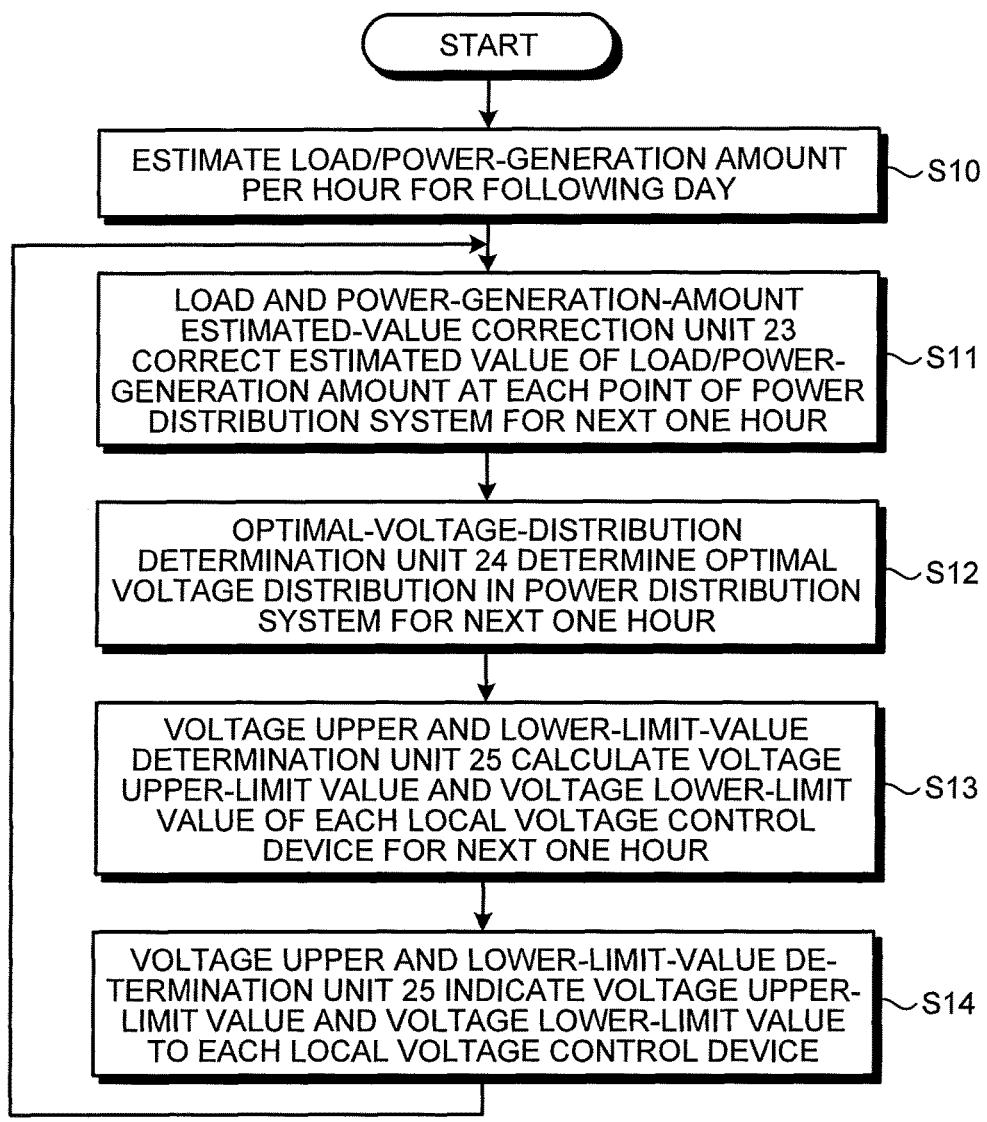
FIG. 5 is a flowchart describing a voltage-control operation.

Next, voltage control in the present embodiment is described. FIG. 5 is a flowchart describing a voltage-control operation in the present embodiment. In the present embodiment, the future load/power-generation-amount distribution in the power distribution system is estimated every day (every 24 hours) (fourth cycle). FIG. 5 illustrates a voltage-control operation for one day. As illustrated in FIG. 5, the load and power-generation-amount estimation unit 22 estimates the load/power-generation-amount distribution and short-cycle fluctuations in the power distribution system, for example, per hour, for the following day on the basis of the load and power-generation amount data at each point of the power distribution system that has been saved in the storage unit 27 (Step S10).

In this case, specifically, in order to separately estimate the load and the power-generation amount, for example, the load and power-generation-amount estimation unit 22 first uses the load and power-generation amount data only in a time slot when the sky is clear among all the load and power-generation amount data saved in the storage unit 27 and then excludes, from the load and power-generation amount data, a theoretical power-generation amount (calculated on the basis of the photovoltaic power-generation rated capacity, solar-panel setting angle, latitude, date and time, estimated temperature, and power-generation efficiency) to calculate the actual load amount that is a pure load amount.

The load and power-generation-amount estimation unit 22 collects actual load amounts, for example, for multiple days and calculates a correlation between the load amount and the temperature in the same time slot on the same day of the week (weekday/weekend category). This correlation is, for example, stored as a relational expression acquired by regression analysis or the like or stored in the form of a table. The load and power-generation-amount estimation unit 22 estimates the load amount at each point of the power distribution system per hour for the following day on the basis of this correlation and the estimated temperature for the following day. As the power-generation amount for the following day, a theoretical power-generation amount based on the weather forecast for the following day is used. The load and power-generation-amount estimation unit 22 subtracts the estimated power-generation amount from the estimated load amount to create load and power-generation amount data at each point of the power distribution system per hour for the following day.

With regard to short-cycle fluctuations, among all the data on the upper fluctuation band and the lower fluctuation band saved in the form of a database, data on the same day of the week (weekday/weekend category) in the same season (in the same month in the case of a monthly-basis database) is read to define the read values as an estimated upper fluctuation band and an estimated lower fluctuation band per hour for the following day at each point of the power distribution system. In this case, the estimated upper fluctuation band and the estimated lower fluctuation band may be acquired using a correlation with the amount of solar radiation. A method for acquiring the estimated upper fluctuation band and the estimated lower fluctuation band using a correlation with the amount of solar radiation is described later.

In the present embodiment, a load/power-generation-amount distribution per hour for the following day is estimated, for example, every day. However, the present invention is not limited thereto, and, for example, a load/power-generation-amount distribution for each given future period can be estimated. This one-hour period or given period is equivalent to the centralized-control cycle described above. The load/power-generation amount is estimated, for example, every hour; however, the measurement values of the voltage and the power flow are stored in the form of a database not as a mean value for one hour but as a mean value for, for example, one minute. The reasons for doing this are to, when acquiring a correlation between the load amount and the temperature in the same time slot on the same day of the week (weekday/weekend category), improve the accuracy of the correlation by increasing the number of pieces of measurement data and to identify the extent of fluctuations in the load amount for one hour. This is available for identifying a time slot during which load fluctuations are large when setting an allowable amount for each voltage control apparatus at Step S21 in FIG. 6 described later. An hourly voltage mean value and an hourly power-flow mean value, for example, may be saved in the form of a database.

Next, the load and power-generation-amount estimated-value correction unit 23 corrects the estimated value of the load/power-generation amount in the power distribution system for the next one hour (Step S11). Specifically, concerning the mean value of the load/power-generation amount at each point of the power distribution system for the past one hour, the load and power-generation-amount estimated-value correction unit 23 compares the actual value (calculated on the basis of the measurement information received in the past one hour) with the estimated value to acquire the ratio between the actual value and the estimated value. The load and power-generation-amount estimated-value correction unit 23 then multiplies the estimated value of the load/power-generation amount for the next one hour by this ratio to correct the estimated value of the load/power-generation amount at each point of the power distribution system for the next one hour. With this correction, the accuracy of the estimated value is expected to improve. In this case, similarly, the estimated upper fluctuation band and the estimated lower fluctuation band may also be corrected on the basis of the ratio between the actual value in the past one hour (the upper fluctuation band and the lower fluctuation band that are calculated on the basis of the measurement information received in the past one hour) and the estimated value (the estimated upper fluctuation band and the estimated lower fluctuation band).

Next, the optimal-voltage-distribution determination unit 24 determines the optimal voltage distribution in the power distribution system for the next one hour on the basis of the corrected estimated value of the load/power-generation amount at each point of the power-distribution system for the next one hour that is created at Step S11 (Step S12). This processing is described later in detail with reference to FIG. 6. The processing at Step S11 for correcting the estimated value of the load/power-generation amount may be omitted and the optimal-voltage-distribution determination unit 24 may determine the optimal voltage distribution in the power distribution system for the next one hour on the basis of the estimated value of the load/power-generation amount at each point of the power distribution system for the following day that is created at Step S10.

Subsequently, on the basis of the optimal voltage distribution in the power distribution system, the voltage upperand-lower-limit-value determination unit 25 calculates the voltage upper-limit value and the voltage lower-limit value of each local voltage control device for the next one hour (Step S13).

Next, the voltage upper-and-lower-limit-value determination unit 25 indicates the voltage upper-limit value and the voltage lower-limit value to each local voltage control device that controls a transformer-type voltage control apparatus (Step S14).

On the basis of the command regarding the voltage upper and lower limit values from the centralized voltage control device 8, each local voltage control device that controls a transformer-type voltage control apparatus adjusts the amount of control of the voltage control apparatus that is a control target. More specifically, each local voltage control device adjusts the amount of control of a voltage control apparatus as required every local-control cycle that is shorter than the centralized-control cycle (one hour) in such a manner as to maintain the voltage between the voltage upper and lower limit values. Every time a command regarding the voltage upper and lower limit values is received from the centralized voltage control device 8 every centralized-control cycle, each local voltage control device updates and sets the voltage upper-limit value and the voltage lower-limit value.

Figure 6:
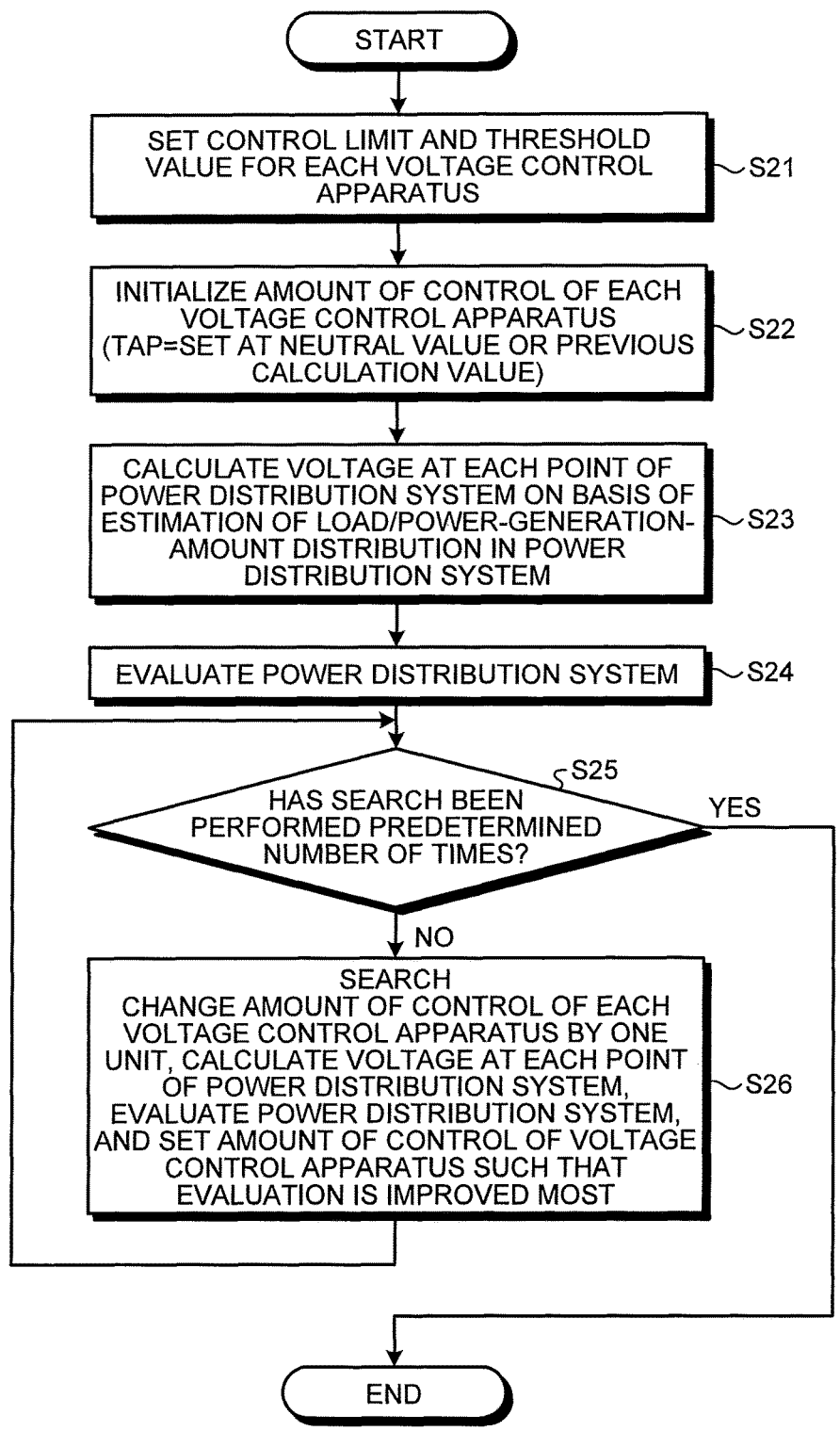
FIG. 6 is a flowchart for calculating an optimal voltage distribution in a power distribution system for the next one hour.

Next, the processing at Step S14 in FIG. 5 is described in detail. FIG. 6 is a flowchart describing the processing at Step S14 in FIG. 5 in detail and illustrates the flow for calculating the optimal voltage distribution in the power distribution system for the next one hour.

First, the optimal-voltage-distribution determination unit 24 sets a control limit for each voltage control apparatus (tap upper and lower limits in the case of a transformer-type voltage control apparatus), and sets a threshold value for the voltage allowance with short-cycle fluctuations taken into account (Step S21). The threshold value is determined on the basis of the estimated upper fluctuation band and the estimated lower fluctuation band. In this case, concerning the time slot during which greater voltage fluctuations are expected, i.e., the time slot during which load fluctuations are large (such as in the morning, before and after the lunch break, and the lighting-up time slot), and the time slot during which fluctuations in power-generation amount are large (such as in the daytime during which a theoretical power-generation amount is large), the optimal-voltage-distribution determination unit 24 may set the threshold value greater than the estimated upper fluctuation band and the estimated lower fluctuation band while taking into account the directionality of fluctuations such as an upward trend or a downward trend.

Next, the optimal-voltage-distribution determination unit 24 initializes the amount of control of each voltage control apparatus (Step S22). In this case, in the case of a transformer-type voltage control apparatus, the optimal-voltage-distribution determination unit 24 sets the tap position to, for example, a calculation value obtained when the optimal voltage distribution one hour before is calculated (or a neutral value when there is no previous calculation value).

Subsequently, on the basis of the estimation of the load/power-generation-amount distribution at each point of the power distribution system, the optimal-voltage-distribution determination unit 24 performs a power-flow calculation with the set amount of control (the tap position) of each voltage control apparatus to calculate the voltage at each point of the power distribution system (Step S23).

Next, the optimal-voltage-distribution determination unit 24 evaluates the power distribution system on the basis of the result of the power-flow calculation (Step S24). Specifically, the optimal-voltage-distribution determination unit 24 evaluates the power distribution system by evaluating the values of evaluation functions (objective functions) that are set for evaluation items of the power distribution system. The first priority evaluation item is the amount of violation (deviation) of the voltage at each point of the power distribution system from an appropriate voltage range (an appropriate-voltage upper-limit value and an appropriate-voltage lower-limit value). That is, the optimal voltage distribution is initially determined in such a manner as to minimize the sum of the amounts of violation (deviation) of the voltage at each point of the power distribution system from the appropriate voltage range.

The second priority evaluation item is, for example, the voltage allowance (an allowable amount for the appropriate-voltage upper and lower limit values) at each point of the power distribution system. When the voltage allowance at each point of the power distribution system is small, the voltage deviates from the appropriate voltage range even upon slight voltage fluctuations. This causes a voltage control apparatus to operate frequently. Therefore, evaluation is higher as the sum of the voltage allowances is larger. In the case where an evaluation function that leads to an optimal solution when the evaluation function takes a minimum is used, the voltage allowance is evaluated using the amount of decrease in voltage allowance that is defined as follows. The amount of decrease in voltage allowance is calculated as described below in such a manner that it becomes zero when the voltage allowance is sufficiently large and becomes greater as the voltage allowance is smaller.

Amount of decrease in voltage allowance=threshold value−voltage allowance, where voltage allowance<threshold value $$\text{Amount of decrease in voltage allowance} = 0, \text{ where voltage allowance} \geq \text{threshold value} \quad (7)$$

The threshold value is a value that is set at Step S21 and is the estimated upper fluctuation band and the estimated lower fluctuation band themselves or a value greater than the estimated upper fluctuation band and the estimated lower fluctuation band. For calculating the amount of decrease in voltage allowance described above, the estimated upper fluctuation band is used as a threshold value for the voltage allowance for the upper-limit value of an appropriate voltage and the estimated lower fluctuation band is used as a threshold value for the voltage allowance for the lower-limit value of an appropriate voltage.

In each transformer (except a step-down transformer connecting to a lower-voltage system), the sum of the maximum value on the appropriate-voltage upper-limit side and the maximum value on the appropriate-voltage lower-limit side at each point within its region responsible for voltage control is acquired.

In the case where "voltage allowance"<"threshold value" and where the voltage value falls within the appropriate voltage range, the voltage does not deviate from the appropriate voltage range; however, voltage allowance violation occurs (the voltage allowance for short-cycle fluctuations cannot be ensured). Therefore, it is desirable that "voltage allowance"≥"threshold value".

The third priority evaluation item can be the sum of the amounts of change in control amount of a voltage control apparatus from its initial setting value. In the case of a transformer-type voltage control apparatus, the amount of change in control amount of a voltage control apparatus from its initial setting value is a difference in tap position from the initial setting tap position. Decreasing the sum of the amounts of change leads to a reduction in the number of times the voltage control apparatus operates.

Further, the fourth priority evaluation item can be the power transmission loss (active power loss+ reactive power loss) in the entire power distribution system. Lower power transmission loss is evaluated higher. The active power loss accounts for the majority of the power transmission loss. As the voltage is higher, the power transmission loss becomes lower. However, when the voltage is higher, the voltage allowance (for the upper-limit value) with the second priority at each point of the power distribution system becomes smaller. Thus, the power transmission loss is an evaluation item that has significance in the case where there is a considerable allowance for the voltage upper and lower limits at each point of the power distribution system.

While an evaluation function can be set for the first priority evaluation item, an evaluation function can also be set for two or more of the evaluation items among the first priority to the fourth priority evaluation items. In this case, a function obtained by weighting each evaluation function and calculating the sum of the evaluation functions is set as an entire evaluation function. Further, depending on the power distribution system, a higher-order priority item can also be included in the evaluation function. The evaluation function can be configured such that the best optimization (highest evaluation) is achieved, for example, when the evaluation function takes a minimum.

For example, in the case of setting an evaluation function on the basis of all the first to fourth priority evaluation items, the evaluation function can be set as expressed in the following equation (8). Wp, W1, W2, and W3 are weighting coefficients.

Evaluation function value=sum of amounts of violation from voltage upper and lower limits at each point of power distribution system×$Wp$+maximum value of amount of decrease in voltage allowance on upper-limit side at each point within region responsible for voltage control of each transformer×$W1$+maximum value of amount of decrease in voltage allowance on lower-limit side at each point within region responsible for voltage control of each transformer×$W1$+amount of change in transformer target voltage from previous command×$W2$+power transmission loss×$W3$ (8)

Next, the optimal-voltage-distribution determination unit 24 determines whether a search has been performed a predetermined number of times (Step S25). When a search has been performed a predetermined number of times (YES at Step S25), the processing ends. When a search has not yet been performed a predetermined number of times (NO at Step S25), the processing proceeds to Step S26.

Subsequently, at Step S26, the optimal-voltage-distribution determination unit 24 changes the amount of control of each voltage control apparatus by one unit (shifting-up/shifting-down the tap, for example, by a single step) to calculate the voltage at each point of the power distribution system (same as Step S23) and to evaluate the power distribution system (same as Step S24). This processing is performed on all the voltage control apparatuses to compare their evaluation results with each other and to change the setting of the amount of control of the voltage control apparatuses such that the evaluation is improved the most (Step S26). For an optimization algorithm, a method disclosed in, for example, Japanese Patent Application Laid-open No. 2010-250599 can be used. After Step S26, the processing returns to Step S25.

As described above, after performing a search a predetermined number of times, the optimal-voltage-distribution determination unit 24 can determine the optimal voltage distribution in the power distribution system and the optimal control amount of each voltage control apparatus for the next one hour as the best solution for optimizing the value of the evaluation function.

Figure 7:
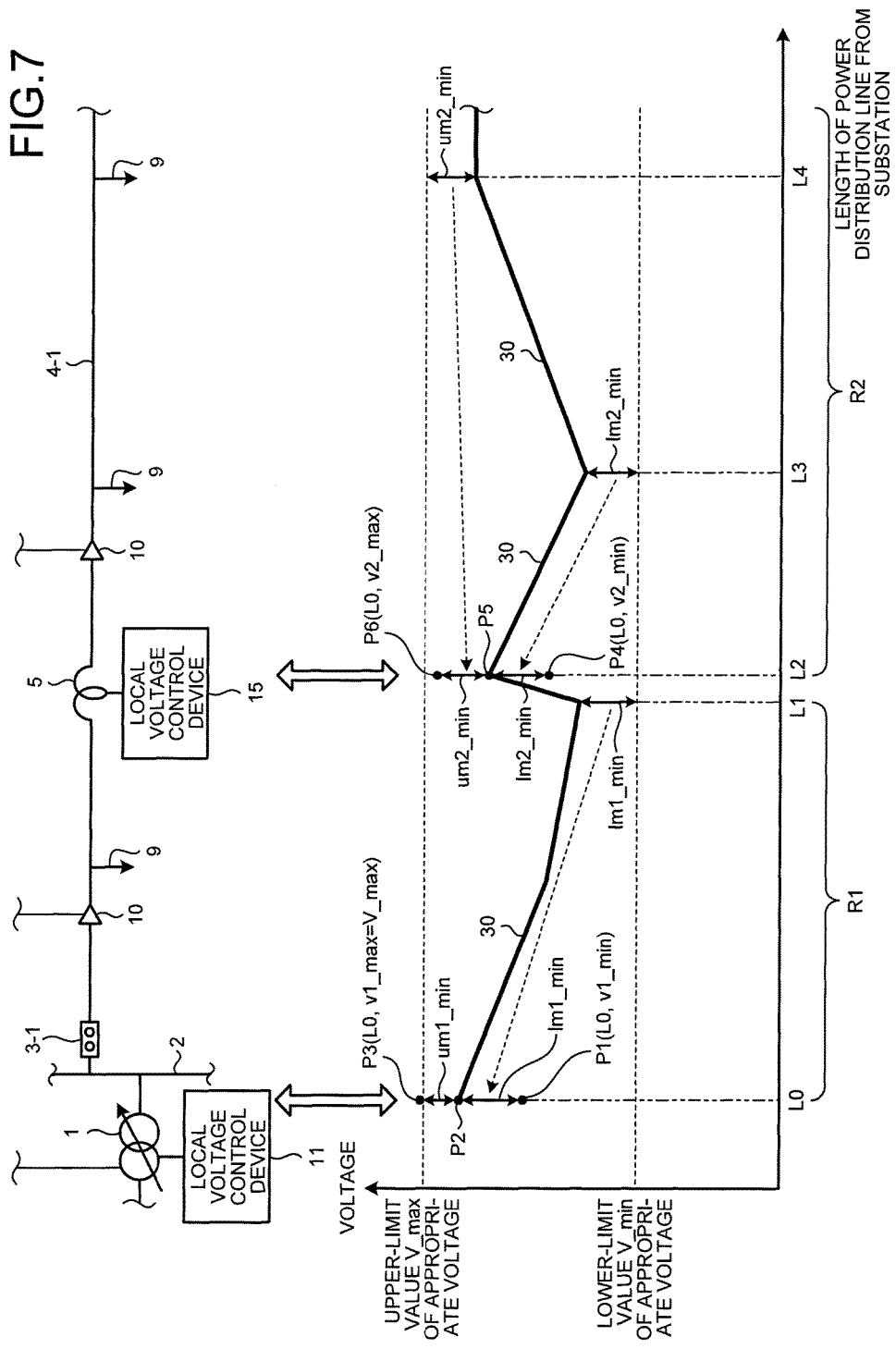
FIG. 7 is a detailed explanatory diagram of processing at Step S14 in FIG. 5.

Next, the processing at Step S14 in FIG. 5 is described in detail. FIG. 7 is a detailed explanatory diagram of the processing at Step S14 in FIG. 5. FIG. 7 illustrates, on its lower side, an optimal voltage 30 relative to the length of the power distribution line 4-1 from the substation. The optimal voltage 30 is acquired by performing the processing at Step S13 in FIG. 5. FIG. 7 also illustrates an upper-limit value V_max and a lower-limit value V_min of an appropriate voltage range. The appropriate voltage range is predetermined depending on the time at each individual load location point as a voltage range that the voltage on the high-voltage side should comply with at each load location point. The appropriate voltage range is set such that power can be stably supplied to the low-voltage side. In FIG. 7, the appropriate voltage range is the same, for example, at each point of the power distribution system. However, it is general that the appropriate voltage range differs at each point of the power distribution system and also changes depending on the time slot.

FIG. 7 illustrates, on its lower side, the secondary side (the load side) of the voltage control apparatus 1 as a starting point (a power-distribution-line length L0), the power-distribution-line length from the starting point to the primary side (the power-supply side) of the voltage control apparatus 5 as L1, and the power-distribution-line length from the starting point to the secondary side of the voltage control apparatus 5 (SVR) as L2.

Each voltage control apparatus has its own individual region responsible for voltage control. The region responsible for voltage control of the voltage control apparatus 1 is a region from the voltage control apparatus 1 to the voltage control apparatus 5 located on the downstream side. FIG. 7 illustrates this region as a region R1 of the power distribution line 4-1 with a power-distribution-line length from L0 to L1. The region responsible for voltage control of the voltage control apparatus 5 is a region from the voltage control apparatus 5 to the next voltage control apparatus located on the downstream side (not illustrated). FIG. 7 illustrates this region as a region R2 of the power distribution line 4-1 with a power-distribution-line length from L2 onward.

The voltage upper-and-lower-limit-value determination unit 25 determines the voltage upper and lower limit values that are upper and lower limits of a control-target voltage range to be indicated to each of the local voltage control devices 11 and 15 in the following manner.

First, the case with the local voltage control device 11 is described. The voltage upper-and-lower-limit-value determination unit 25 selects the minimum value of the voltage upper-limit allowable amount that is the difference between the optimal voltage 30 and the upper-limit value V_max of the appropriate voltage within the region R1, which is the region responsible for voltage control of the local voltage control device 11. In the illustrated example, the minimum voltage-upper-limit allowable amount is given at the point of the power-distribution-line length L0. This value is represented as um1_min. The voltage upper-and-lower-limit-value determination unit 25 selects the minimum value of the voltage lower-limit allowable amount that is the difference between the optimal voltage 30 and the lower-limit value V_min of the appropriate voltage within the region R1, which is the region responsible for voltage control of the local voltage control device 11. In the illustrated example, the minimum voltage-lower-limit allowable amount is given at the point of the power-distribution-line length L1. This value is represented as lm1_min. The voltage upper-and-lower-limit-value determination unit 25 sets a value, obtained by adding the minimum voltage-upper-limit allowable amount um1_min to the value of the optimal voltage 30 of the voltage control apparatus 1, as the voltage upper-limit value of the control-target voltage range. The voltage upper-and-lower-limit-value determination unit 25 sets a value, obtained by subtracting the minimum voltage-lower-limit allowable amount lm1_min from the value of the optimal voltage 30 of the voltage control apparatus 1, as the voltage lower-limit value of the control-target voltage range. More specifically, the value of the optimal voltage 30 of the voltage control apparatus 1 is a value of the optimal voltage 30 on the output side (the load side or the secondary side) of the voltage control apparatus 1 and indicates the voltage value at a point represented by P2 in FIG. 7. The voltage upper-limit value is represented as v1_max. The voltage lower-limit value is represented as v1_min. The control-target voltage range of the local voltage control device 11 is a range between the point P3 and the point P1. In the illustrated example, v1_max=V_max.

In this manner, the control-target voltage range of the local voltage control device 11 is determined by taking into consideration, not only the voltage upper and lower limit allowable amounts near the location point of the voltage control apparatus 1, but also the voltage upper and lower limit allowable amounts at each point within the region R1, which is the region responsible for voltage control of the local voltage control device 11. Therefore, although the local voltage control device 11 itself locally controls the voltage control apparatus 1 within its control-target voltage range, it is still possible to maintain the appropriate voltage within the wide region R1.

Next, the case with the local voltage control device 15 is described. The voltage upper-and-lower-limit-value determination unit 25 selects the minimum value of the voltage-upper-limit allowable amount that is an absolute value of the difference between the optimal voltage 30 and the upper-limit value V_max of the appropriate voltage within the region R2, which is the region responsible for voltage control of the local voltage control device 15. In the illustrated example, the minimum voltage-upper-limit allowable amount is given at the point of a power-distribution-line length L4. This value is represented as um2_min. The voltage upper-and-lower-limit-value determination unit 25 selects the minimum value of the voltage-lower-limit allowable amount that is an absolute value of the difference between the optimal voltage 30 and the lower-limit value V_min of the appropriate voltage within the region R2, which is the region responsible for voltage control of the local voltage control device 15. In the illustrated example, the minimum voltage-lower-limit allowable amount is given at the point of a power-distribution-line length L3. This value is represented as lm2_min. The voltage upper-and-lower-limit-value determination unit 25 sets a value, obtained by adding the minimum voltage-upper-limit allowable amount um2_min to the value of the optimal voltage 30 of the voltage control apparatus 5, as the voltage upper-limit value of the control-target voltage range. The voltage upper-and-lower-limit-value determination unit 25 sets a value, obtained by subtracting the minimum voltage-lower-limit allowable amount lm2_min from the value of the optimal voltage 30 of the voltage control apparatus 5, as the voltage lower-limit value of the control-target voltage range. More specifically, the value of the optimal voltage 30 of the voltage control apparatus 5 is a value of the optimal voltage 30 on the output side (the load side or the secondary side) of the voltage control apparatus 5 and indicates a voltage value at a point represented by P5 in FIG. 7. In the case where a voltage control apparatus is a reactive-power compensator, the optimal voltage of the voltage control apparatus is the optimal voltage at a connection point of the voltage control apparatus to the power distribution system. In FIG. 7, the voltage upper-limit value is represented as v2_max, the voltage lower-limit value is represented as v2_min, and the control-target voltage range of the local voltage control device 15 is the range between the point P4 and the point P6.

In this manner, the control-target voltage range of the local voltage control device 15 is determined by taking into consideration, not only the voltage upper and lower limit allowable amounts near the location point of the voltage control apparatus 5, but also the voltage upper and lower limit allowable amounts at each point within the region R2, which is the region responsible for voltage control of the local voltage control device 15. Therefore, although the local voltage control device 15 itself locally controls the voltage control apparatus 5 within its control-target voltage range, it is still possible to maintain the appropriate voltage within the wide region R2.

Figure 8:
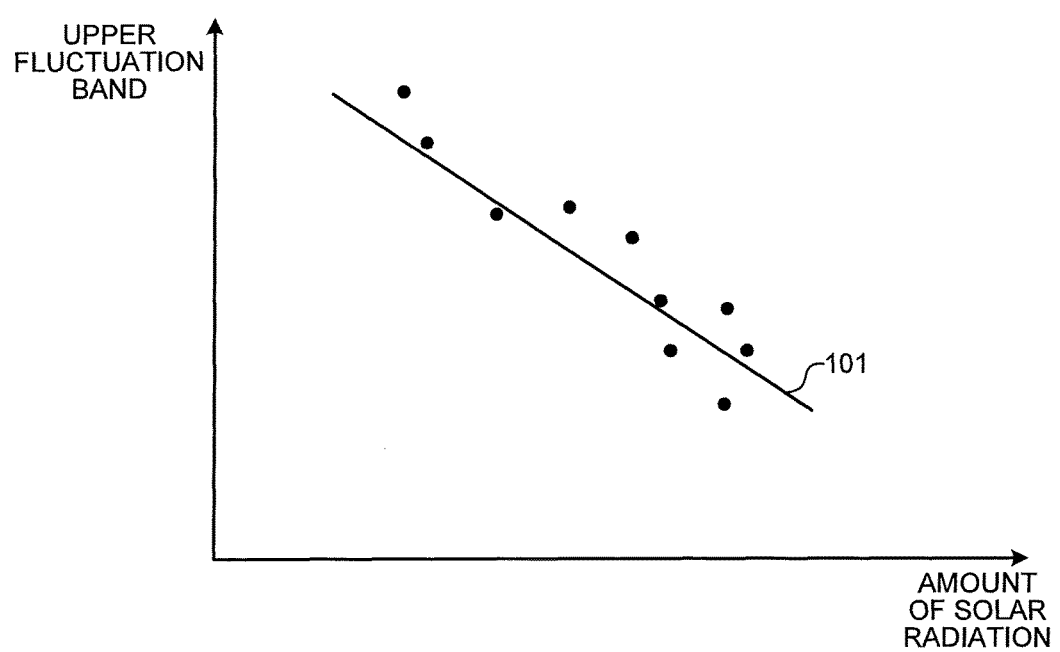
FIG. 8 is a diagram illustrating an example in which an upper fluctuation band for a given period and the amount of solar radiation are plotted.

Next, an explanation will be made of a case where a correlation with the amount of solar radiation is used for acquiring estimated values of the upper fluctuation band and the lower fluctuation band for the following day at Step S10 in FIG. 5. In this case, the upper fluctuation band and the lower fluctuation band are stored in the storage unit 27 in association with the amount of solar radiation. On the basis of the stored data for a given period, the load and power-generation-amount estimation unit 22 acquires a correlation between the upper fluctuation band and the amount of solar radiation and a correlation between the lower fluctuation band and the amount of solar radiation, for each piece of data in the same time slot and on the same day of the week. FIG. 8 is a diagram illustrating an example in which the upper fluctuation band for a given period and its corresponding amount of solar radiation stored in the storage unit 27 are plotted. Each point in FIG. 8 illustrates a data point stored in the storage unit 27. While FIG. 8 is a conceptual diagram, an actual correlation does not always appear in such a manner as illustrated in FIG. 8. On the basis of these data points, an approximate curve 101 is acquired by using regression analysis or the like, and a correlation between the upper fluctuation band and the amount of solar radiation is stored as a relational expression or in the form of a table. The load and power-generation-amount estimation unit 22 acquires a correlation between the lower fluctuation band and the amount of solar radiation in the same manner as above and stores the correlation as a relational expression or in the form of a table. The processing as described above is performed on each time slot and each day of the week and a correlation is stored in the storage unit 27 for each combination of the time slot and the day of the week. At Step S10 in FIG. 5, a correlation corresponding to an estimation-target time slot and day of the week is used to estimate the amount of solar radiation on the basis of the estimated values of the weather and the like. The upper fluctuation band and the lower fluctuation band corresponding to the estimated amount of solar radiation are set as the estimated upper fluctuation band and the estimated lower fluctuation band, respectively.

As described above, in the present embodiment, the voltage and power-flow measurement device 10 and the smart meter 12 measure a voltage and a power flow, and transmit, to the centralized voltage control device 8, the result of the statistical processing performed on the measurement data as measurement information. On the basis of the measurement information, the centralized voltage control device 8 then acquires a fluctuation band (the upper fluctuation band and the lower fluctuation band) of short-cycle fluctuations within the centralized-control cycle, and acquires the optimal voltage distribution within the future given period (within the period of the centralized-control cycle) by taking into consideration the fluctuation band. Thereafter, concerning a transformer-type voltage control apparatus, the centralized voltage control device 8 determines the voltage upper and lower limit values to be indicated to each local voltage control device by taking into consideration voltage upper and lower limit allowable amounts at each point within the region responsible for voltage control of each local voltage control device on the basis of the relation between the optimal voltage distribution and an appropriate voltage range.

With this operation, it is possible to maintain the voltage by following even voltage fluctuations in the power distribution system due to unpredictable factors such as a change in the amount of photovoltaic power generation. Also, short-cycle fluctuations are ensured as a voltage allowance. Therefore, a voltage violation caused by the short-cycle fluctuations can be suppressed. The voltage and power-flow measurement device 10 and the smart meter 12 transmit the result of the statistical processing; therefore, the communication load can be reduced.

In the present embodiment, the load/power-generation amount is estimated and the voltage upper and lower limit values are indicated to a local voltage control device, for example, hourly. However, this is not a limitation, and the load/power-generation amount can be estimated and the voltage upper and lower limit values can be indicated, for example, every several tens of minutes (e.g., 30 minutes) to several hours or at a time interval equal to or longer than several hours. Further, it is possible to transmit a command regarding the voltage upper and lower limit values to a local voltage control device only when the voltage upper and lower limit values greatly change. This further reduces the communication load.

In preparation for the case where there is a local voltage control device that cannot receive voltage upper and lower limit value commands every centralized-control cycle from the centralized voltage control device due to a communication fault or other problems, it is also possible to transmit in advance the voltage upper and lower limit values for multiple time slots (for example, for the next one day) from the centralized voltage control device to a local voltage control device and to store these limit values in the local voltage control device. In this case, when a communication abnormality in a certain local voltage control device occurs, the local voltage control device can operate on the basis of these stored voltage upper and lower limit values and also the centralized voltage control device can estimate an operation of the local voltage control device. In this case, the processing at Step S11 in FIG. 5 for correcting the estimated value of the load/power-generation amount is omitted.

In the present embodiment, there has been described an example in which a transformer-type voltage control apparatus is connected to the power distribution system. However, aside from the transformer-type voltage control apparatus, other voltage control apparatuses may be connected to the power distribution system, such as an SVC (Static Var Compensator: static reactive-power compensator), a phase modifying facility (such as a phase advancing capacitor or a shunt reactor), or a PCS (Power Conditioning System: power conditioner) with a reactive-power modifying function. In the case where a reactive-power-modified voltage control apparatus, such as an SVC, is connected to the power distribution system, the reactive-power-modified voltage control apparatus is controlled by using autonomous control by a local control device connected to the voltage control apparatus. Therefore, the centralized voltage control device does not indicate a control target value. It is satisfactory if the reactive-power-modified voltage control apparatus is set to zero in the processing for determining the optimal voltage distribution in the power distribution system. The centralized voltage control device may indicate a control target value to the reactive-power-modified voltage control apparatus. In this case, in the processing for determining the optimal voltage distribution in the power distribution system, the control target value is also set for the reactive-power-modified voltage control apparatus. The reactive-power-modified voltage control apparatus uses the control target value indicated from the centralized voltage control device as a control target and removes short-cycle fluctuations by using autonomous control.

As the voltage control apparatus, other than the transformer-type voltage control apparatus, there is a reactive-power-controlled voltage control apparatus such as the SVC as described above. The reactive-power-controlled voltage control apparatus has a function of autonomously removing short-cycle fluctuations. However, the reactive-power-controlled voltage control apparatus is expensive. Therefore, when many reactive-power-controlled voltage control apparatuses are provided in order to suppress short-cycle fluctuations at all the points within the power distribution system, costs are increased. In the present embodiment, short-cycle fluctuations can be suppressed by adding a simple function to the voltage and power-flow measurement device and to the centralized voltage control device. Therefore, costs can be reduced when compared to a case where an SVC is provided. Even when the reactive-power-controlled voltage control apparatus is provided, short-cycle fluctuations may still remain depending on the position. In the present embodiment, even when the reactive-power-controlled voltage control apparatus cannot remove a part of the short-cycle fluctuations as described above, the unremoved part of the short-cycle fluctuations is considered to be an allowable amount; therefore, voltage deviation can be suppressed.

INDUSTRIAL APPLICABILITY

As described above, the voltage monitoring control system, the voltage monitoring control device, the measurement device, and the voltage monitoring control method according to the present invention are useful for a system that controls a voltage in a power distribution system.

REFERENCE SIGNS LIST 1, 5, 6 voltage control apparatus, 2 bus-bar, 3-1, 3-2 breaker, 4-1, 4-2 power distribution line, 7, 14 communication network, 8 centralized voltage control device, 10 voltage and power-flow measurement device, 11, 15, 16 local voltage control device, 12 smart meter, 13 MDM device, 20 control unit, 21 voltage-fluctuation-band calculation unit, 22 load and power-generation-amount estimation unit, 23 load and power-generation-amount estimated-value correction unit, 24 optimal-voltage-distribution determination unit, 25 voltage upper-and-lower-limit-value determination unit, 26 transceiver unit, 27 storage unit.

The invention claimed is:

1. A voltage monitoring control system comprising:
a plurality of voltage control apparatuses that are connected to a power distribution line in a high-voltage system and control a voltage on the power distribution line;
a plurality of local voltage control devices to adjust an amount of control of the voltage control apparatuses such that a voltage value controlled by the voltage control apparatuses is maintained within a range between a voltage upper-limit value and a voltage lower-limit value that are updated every first cycle;
a measurement device that is connected to the power distribution line, that measures a voltage on the power distribution line every second cycle, which is shorter than the first cycle, that calculates fluctuation-band information, which indicates a fluctuation band of the voltage, on a basis of a measured voltage every third cycle, which is longer than the second cycle, and that transmits the fluctuation-band information; and
a voltage monitoring control device that is connected to the local voltage control devices and the measurement device via a communication network, wherein
the voltage monitoring control device includes
a transceiver unit to communicate with the local voltage control devices via the communication network and receive the fluctuation-band information from the measurement device via the communication network,
a voltage-fluctuation-band calculation unit to calculate a fluctuation band of the voltage within the first cycle on a basis of the fluctuation-band information,
a control-target-voltage determination unit to determine a first threshold value for an allowance for an upper limit of an appropriate voltage range and a second threshold value for an allowance for a lower limit of an appropriate voltage range on a basis of the fluctuation band calculated by the voltage-fluctuation-band calculation unit, and to determine a control target value to be indicated to each of the local voltage control devices on a basis of a difference between the first threshold value and the allowance for the upper limit and on a basis of a difference between the second threshold value and the allowance for the lower limit, and
a voltage upper-and-lower-limit-value determination unit to determine a voltage upper-limit value and a voltage lower-limit value to be transmitted to each of the local voltage control devices via the transceiver unit on a basis of the control target value.

2. The voltage monitoring control system according to claim 1, wherein the fluctuation-band information is a standard deviation of the measured voltages within the third cycle.

3. The voltage monitoring control system according to claim 1, wherein the fluctuation-band information is a standard deviation and a mean value of the measured voltages within the third cycle.

4. The voltage monitoring control system according to claim 3, wherein the voltage-fluctuation-band calculation unit acquires an estimated maximum value within the third cycle by adding the mean value and a value obtained by multiplying the standard deviation by a predetermined value, acquires an estimated minimum value within the third cycle by subtracting, from the mean value, a value obtained by multiplying the standard deviation by a predetermined value, acquires a mean value of the mean values within the first cycle as an intra-cycle mean value, acquires, as an upper fluctuation band, a value obtained by subtracting the intra-cycle mean value from a maximum value of the estimated maximum values within the first cycle, and acquires, as a lower fluctuation band, a value obtained by subtracting a minimum value of the estimated minimum value within the first cycle from the intra-cycle mean value.

5. The voltage monitoring control system according to claim 1, wherein the fluctuation-band information is a maximum value and a minimum value of the measured voltages within the third cycle.

6. The voltage monitoring control system according to claim 1, wherein the fluctuation-band information is a maximum value and a minimum value of the measured voltages within the third cycle and a mean value of the measured voltages within the third cycle.

7. The voltage monitoring control system according to claim 6, wherein the voltage-fluctuation-band calculation unit acquires, as an intra-cycle maximum value, a maximum value of the maximum values within the first cycle, acquires, as an intra-cycle minimum value, a minimum value of the minimum values within the first cycle, acquires, as an intra-cycle cycle mean value, a mean value of the mean values within the first cycle, acquires, as an upper fluctuation band, a value obtained by subtracting the intra-cycle mean value from the intra-cycle maximum value, and acquires, as a lower fluctuation band, a value obtained by subtracting the intra-cycle minimum value from the intra-cycle mean value.

8. The voltage monitoring control system according to claim 1, wherein the fluctuation-band information is a value obtained by subtracting a mean value of the measured voltages within the third cycle from a maximum value of the measured voltages within the third cycle and a value obtained by subtracting a minimum value of the measured voltages within the third cycle from the mean value.

9. The voltage monitoring control system according to claim 1, wherein the fluctuation-band information is a value obtained by multiplying, by $\frac{1}{2}$, a value obtained by subtracting a minimum value of the measured voltages within the third cycle from a maximum value of the measured voltages within the third cycle.

10. The voltage monitoring control system according to claim 1, further comprising a load and power-generation-amount estimation unit to estimate a load and power-generation-amount distribution representing a difference between a pure load and a power-generation amount at each point of the power distribution line every fourth cycle, which is equal to or longer than the first cycle, wherein
the control-target-voltage determination unit determines an optimal voltage distribution within a period of the first cycle by performing power-flow calculation on a basis of the load and power-generation-amount distribution estimated by the load and power-generation-amount estimation unit and by searching for a best solution for optimizing a value of an evaluation function that is set for an evaluation item of the power distribution line, determines the control target value on a basis of the optimal voltage distribution, and includes, as the evaluation function, an evaluation function that is based on a difference between the first threshold value and an allowance for the upper limit and based on a difference between the second threshold value and an allowance for the lower limit.

11. A voltage monitoring control device comprising:
a transceiver unit to communicate, via a communication network, with a plurality of local voltage control devices that adjust an amount of control of a plurality of voltage control apparatuses such that a voltage value controlled by the voltage control apparatuses is maintained within a range between a voltage upper-limit value and a voltage lower-limit value that are updated every first cycle, where the voltage control apparatuses are connected to a power distribution line in a high-voltage system and control a voltage on the power distribution line, and to receive, via the communication network, fluctuation-band information from a measurement device that is connected to the power distribution line and calculates, on a basis of a voltage on the power distribution line measured every second cycle, which is shorter than the first cycle, the fluctuation-band information, which indicates a fluctuation band of the voltage, every third cycle, which is longer than the second cycle;
a voltage-fluctuation-band calculation unit to calculate a fluctuation band of the voltage within the first cycle on a basis of the fluctuation-band information;
a control-target-voltage determination unit to determine a first threshold value for an allowance for an upper limit of an appropriate voltage range and a second threshold value for an allowance for a lower limit of an appropriate voltage range every first cycle on a basis of the fluctuation band calculated by the voltage-fluctuation-band calculation unit, and to determine a control target value to be indicated to each of the local voltage control devices on a basis of a difference between the first threshold value and the allowance for the upper limit and on a basis of a difference between the second threshold value and the allowance for the lower limit; and
a voltage upper-and-lower-limit-value determination unit to determine the voltage upper-limit value and the voltage lower-limit value to be transmitted to each of the local voltage control devices via the transceiver unit on a basis of the control target value.

12. A measurement device in a monitoring control system that includes a plurality of voltage control apparatuses that are connected to a power distribution line in a high-voltage system and control a voltage on of the power distribution line, a plurality of local voltage control devices to adjust an amount of control of the voltage control apparatuses such that a voltage value controlled by the voltage control apparatuses is maintained within a range between a voltage upper-limit value and a voltage lower-limit value that are updated every first cycle, the measurement device connected to the power distribution line, and a voltage monitoring control device to calculate a fluctuation band of a voltage within the first cycle on a basis of fluctuation-band information, which is received from the measurement device and indicates a fluctuation band of a voltage on the power distribution line, determine a first threshold value for an allowance for an upper limit of an appropriate voltage range and a second threshold value for an allowance for a lower limit of an appropriate voltage range on a basis of the fluctuation band, determine a control target value to be indicated to each of the local voltage control devices on a basis of a difference between the first threshold value and the allowance for the upper limit and on a basis of a difference between the second threshold value and the allowance for the lower limit, and determine a voltage upper-limit value and a voltage lower-limit value to be transmitted to each of the local voltage control devices on a basis of the control target value, wherein
the measurement device measures a voltage on the power distribution line every second cycle, which is shorter than the first cycle, calculates, on a basis of a measured voltage, the fluctuation-band information every third cycle, which is longer than the second cycle, and transmits the fluctuation-band information to the voltage monitoring control device via a communication network.

13. A voltage monitoring control method in a monitoring control system including a plurality of voltage control apparatuses that are connected to a power distribution line in a high-voltage system and control a voltage on the power distribution line, a plurality of local voltage control devices to adjust an amount of control of the voltage control apparatuses on a basis of a voltage upper-limit value and a voltage lower-limit value that are updated every first cycle, and a voltage monitoring control device to indicate, via a communication network, the voltage upper-limit value and the voltage lower-limit value to the local voltage control devices every first cycle, the voltage monitoring control method comprising:
a measurement device measuring a voltage on the power distribution line every second cycle, which is shorter than the first cycle, calculating fluctuation-band information, which indicates a fluctuation band of the voltage, every third cycle, which is longer than the second cycle, on a basis of a measured voltage, and transmitting the fluctuation-band information to the voltage monitoring control device via the communication network;
the voltage monitoring control device receiving the fluctuation-band information;
the voltage monitoring control device calculating a fluctuation band of the voltage within the first cycle on a basis of the fluctuation-band information;
the voltage monitoring control device determining a first threshold value for an allowance for an upper limit of an appropriate voltage range and a second threshold value for an allowance for a lower limit of an appropriate voltage range every first cycle on a basis of the fluctuation band calculated at the voltage-fluctuation-band calculating and determining a control target value to be indicated to each of the local voltage control devices on a basis of a difference between the first threshold value and the allowance for the upper limit and on a basis of a difference between the second threshold value and the allowance for the lower limit;
the voltage monitoring control device determining the voltage upper-limit value and the voltage lower-limit value for each of the local voltage control devices on a basis of the control target value;
transmitting the voltage upper-limit value and the voltage lower-limit value to each of the local voltage control devices; and
the local voltage control devices adjusting an amount of control of the voltage control apparatuses such that a voltage value controlled by the voltage control apparatuses is maintained within a range between a voltage upper-limit value and a voltage lower-limit value that are updated every first cycle.

* * * * *